United States Patent
Zang et al.

(10) Patent No.: US 11,870,124 B2
(45) Date of Patent: Jan. 9, 2024

(54) BALANCE-UNBALANCE CONVERSION APPARATUS, COMMUNICATIONS DEVICE, AND COMMUNICATIONS SYSTEM

(71) Applicant: HUAWEI TECHNOLOGIES CO., LTD., Guangdong (CN)

(72) Inventors: Dajun Zang, Dongguan (CN); Cuicui Wang, Beijing (CN); Daochun Mo, Shenzhen (CN); Yuchun Lu, Beijing (CN); Linchun Wang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 300 days.

(21) Appl. No.: 17/244,741

(22) Filed: Apr. 29, 2021

(65) Prior Publication Data

US 2021/0249747 A1    Aug. 12, 2021

Related U.S. Application Data

(63) Continuation of application No. PCT/CN2019/112784, filed on Oct. 23, 2019.

(30) Foreign Application Priority Data

Oct. 31, 2018    (CN) .......................... 201811299393.5

(51) Int. Cl.
*H01P 5/10*    (2006.01)
*H01P 3/08*    (2006.01)
(Continued)

(52) U.S. Cl.
CPC .................. *H01P 5/10* (2013.01); *H01P 3/08* (2013.01); *H03H 7/42* (2013.01); *H04B 3/54* (2013.01)

(58) Field of Classification Search
CPC .... H01P 5/10; H01P 3/08; H03H 7/42; H04B 3/54
See application file for complete search history.

(56) References Cited

U.S. PATENT DOCUMENTS 5,808,529 A    9/1998   Hamre
6,677,831 B1*  1/2004   Cheng .................... H05K 1/025
                                                           333/236
(Continued)

FOREIGN PATENT DOCUMENTS

CN    102306861 A    1/2012
CN    102306862 A    1/2012
(Continued)

OTHER PUBLICATIONS

Office Action in Chinese Application No. 201811299393.5, dated Aug. 27, 2020, 17 pages.
(Continued)

*Primary Examiner* — Samuel S Outten
(74) *Attorney, Agent, or Firm* — Fish & Richardson P.C.

(57) ABSTRACT

Embodiments of this application provide a balance-unbalance conversion apparatus. The apparatus includes an insulation substrate, a first microstrip, a second microstrip, and a conductive ground. The first microstrip includes a first balance signal connection section, a first impedance matching section, and an unbalance signal connecting section. The unbalance signal connecting section is configured to transmit an unbalance signal. The second microstrip includes a second balance signal connecting section, a second impedance matching section, and a ground section. The second balance signal connecting section is configured to transmit a second component of the balance signal. The ground section is configured to connect to a ground signal. The first microstrip, the second microstrip, and the conductive ground are all disposed on the insulation substrate, and a cross-
(Continued)

sectional area of at least a part of the first microstrip and/or at least a part of the second microstrip is gradient.

20 Claims, 12 Drawing Sheets

(51) Int. Cl.
H03H 7/42 (2006.01)
H04B 3/54 (2006.01)

(56) References Cited

U.S. PATENT DOCUMENTS

| | | | |
|---|---|---|---|
| 7,646,988 B2 | 1/2010 | Nguyen et al. | |
| 2002/0003454 A1 | 1/2002 | Sweeney et al. | |
| 2002/0196096 A1 | 12/2002 | Tajima | |
| 2006/0087379 A1* | 4/2006 | Bartley | H01P 5/02 333/34 |
| 2010/0182096 A1* | 7/2010 | Kim | H01P 5/10 333/26 |
| 2011/0019706 A1 | 1/2011 | Moto et al. | |
| 2012/0049971 A1* | 3/2012 | Gerst | H01P 5/10 29/846 |
| 2018/0131070 A1 | 5/2018 | Cammarata | |

FOREIGN PATENT DOCUMENTS

| | | |
|---|---|---|
| CN | 102709658 A | 10/2012 |
| CN | 102810704 A | 12/2012 |
| CN | 102983388 A | 3/2013 |
| CN | 103338019 A | 10/2013 |
| CN | 105356858 A | 2/2016 |
| CN | 106257777 A | 12/2016 |
| CN | 107438947 A | 12/2017 |
| KR | 20100080652 A | 7/2010 |

OTHER PUBLICATIONS

PCT International Search Report and Written Opinion in International Application No. PCT/CN2019/112784, dated Feb. 6, 2020, 16 pages.

Extended European Search Report issued in European Application No. 19880245.6 dated Oct. 26, 2021, 11 pages.

Zheng et al., "Design of a Compact Wideband Balun between Microstrip and Coplanar Stripline," 2012 IEEE MTT-S International Microwave Workshop Series on Millimeter Wave Wireless Technology and Applications, Sep. 2012, 3 pages.

* cited by examiner

BALANCE-UNBALANCE CONVERSION APPARATUS, COMMUNICATIONS DEVICE, AND COMMUNICATIONS SYSTEM

CROSS-REFERENCE TO RELATED APPLICATIONS

This application is a continuation of International Application No. PCT/CN2019/112784, filed on Oct. 23, 2019, which claims priority to Chinese Patent Application No. 201811299393.5, filed on Oct. 31, 2018. The disclosures of the aforementioned applications are hereby incorporated by reference in their entireties.

TECHNICAL FIELD

This application relates to the field of communications device technologies, and in particular, to a balance-unbalance conversion apparatus, a communications device, and a communications system.

BACKGROUND

In a current data communications device, a differential signal line is used for all electrical interconnections. The differential signal line is used because a high-speed serializer/deserializer (Serializer/Deserializer, Serdes) of a chip is a differential signal interface, so that a differential signal has better immunity to common-mode noise from a power supply or the like when the chip performs on-chip signal processing and undergoes encapsulation and cabling. However, in a high-speed communications system of a backplane/rack or an inter-subrack high-speed communications system, a biaxial transmission line is usually used to transmit a signal, and the biaxial transmission line has the following problems: The biaxial transmission line includes two signal lines and one ground line, and therefore has a large diameter and occupies large cabling space. A bending capability is limited, and the biaxial transmission line is not easy to bend in an axial direction. In addition, the biaxial transmission line has a strict requirement on process control, and a process is expensive. A delay in a differential pair needs to be controlled to avoid performance loss.

To resolve the foregoing problems, a coaxial cable may be used to replace a biaxial cable to transmit a signal. In this case, a Serdes differential signal of a chip on a transmit side needs to be converted into a single-ended signal without energy loss, and the single-ended signal is converted into a Serdes-required differential signal on a receive side. In addition, differential impedance of the Serdes is usually 100Ω or 90Ω, and impedance of the coaxial cable is 50Ω or 75Ω. Due to these two factors, a proper conversion apparatus needs to be designed. The conversion apparatus may implement an impedance transition between the Serdes side and the coaxial cable while converting the differential signal into the single-ended signal. The conversion apparatus is usually referred to as a balun (Balance-unbalance, BALUN), which is a transliteration of an abbreviation of "balance-unbalance converter" in English.

In an implementation of the balun, as shown in FIG. 1, the balun includes two transmission lines of equal lengths: a first transmission line 01 and a second transmission line 02. Left ends of the first transmission line 01 and the second transmission line 02 are connected in parallel, and right ends of the first transmission line 01 and the second transmission line 02 are connected in series. If impedance of the first transmission line 01 is 2×Z0 and impedance of the second transmission line 02 is also 2×Z0, when a signal is injected from the left ends by using Z0, the first transmission line 01 and the second transmission line 02 each obtain half of signal energy, and the signal energy is transmitted to the right by using a traveling wave. When the signal simultaneously arrives at the right ends, because the right ends are connected in series, a voltage and impedance are increased through superposition, implementing an exact transition to impedance of 4×Z0 of an output port on the right. However, the balun shown in FIG. 1 is not conducive to cabling. In addition, a structure is complex, and large space is occupied.

SUMMARY

Embodiments of this application provide a balance-unbalance conversion apparatus, a communications device, and a communications system, to resolve a prior-art problem that a balance-unbalance conversion apparatus is not conducive to cabling and occupies comparatively large space.

According to a first aspect, this application provides a balance-unbalance conversion apparatus, including:
an insulation substrate;
a first microstrip, where the first microstrip includes a first balance signal connecting section, a first impedance matching section, and an unbalance signal connecting section that are sequentially connected, the first balance signal connecting section is configured to transmit a first component of a balance signal, and the unbalance signal connecting section is configured to transmit an unbalance signal;
a second microstrip, where the second microstrip includes a second balance signal connecting section, a second impedance matching section, and a ground section that are sequentially connected, the second balance signal connecting section is configured to transmit a second component of the balance signal, and the ground section is configured to connect to a ground signal; and
a conductive ground (Ground, GND), where the conductive ground is a reference ground of the first balance signal connecting section and the second balance signal connecting section, where
the first microstrip, the second microstrip, and the conductive ground are all disposed on the insulation substrate, the first balance signal connecting section and the second balance signal connecting section are located on a same plane of the insulation substrate, the first impedance matching section of the first microstrip and the second impedance matching section of the second microstrip are separated by the insulation substrate; and a cross-sectional area of at least a part of the first microstrip and/or at least a part of the second microstrip is gradient.

According to the balance-unbalance conversion apparatus provided in this embodiment of this application, a first component of a differential alternating-current signal (or referred to as a balance signal) is connected by using the first balance signal connecting section, a second component of the differential alternating-current signal is connected by using the second balance signal connecting section, and after the two parts of the differential signal separately pass through the first impedance matching section and the second impedance matching section, an unbalance signal port outputs a single-ended signal (or referred to as an unbalance signal), thereby converting the differential signal into the single-ended signal. Because the cross-sectional area of at least a part of the first microstrip and/or at least a part of the second microstrip is gradient, an impedance value may be adjusted, so that a smooth transition from impedance formed by the first balance signal connecting section, the second balance signal connecting section, and the conductive ground to impedance formed by the unbalance signal connecting section and the ground section is implemented. According to the balance-unbalance conversion apparatus provided in this embodiment of this application, a microstrip replaces a transmission line cable such as a coaxial cable or a twisted pair in the prior art to serve as a signal conductor. Therefore, the balance-unbalance conversion apparatus may be integrated on a substrate (for example, a PCB board), thereby eliminating complex cabling work, and reducing installation space and manufacturing costs.

In a possible implementation, the first impedance matching section of the first microstrip is parallel to the second impedance matching section of the second microstrip.

In a possible implementation, a cross-sectional area of the first impedance matching section may gradually increase in a direction toward the unbalance signal connecting section, so that impedance of the first impedance matching section gradually decreases in a direction toward the unbalance signal connecting section; and a cross-sectional area of the second impedance matching section gradually increases in a direction toward the ground section, so that impedance of the second impedance matching section gradually decreases in a direction toward the ground section.

In a possible implementation, a cross-sectional area of the first impedance matching section may gradually decrease in a direction toward the unbalance signal connecting section, so that impedance of the first impedance matching section gradually increases in a direction toward the unbalance signal connecting section; and a cross-sectional area of the second impedance matching section may gradually decrease in a direction toward the ground section, so that impedance of the second impedance matching section gradually increases in a direction toward the ground section.

In a possible implementation, a cross-sectional width of a microstrip may remain unchanged, and a cross-sectional thickness of the microstrip is gradient.

In a possible implementation, a cross-sectional thickness of a microstrip may remain unchanged, and a cross-sectional width of the microstrip is gradient. This solution can facilitate manufacturing of a gradient microstrip.

In a possible implementation, both a cross-sectional thickness of a microstrip and a cross-sectional width of the microstrip may be gradient.

In a possible implementation, the first balance signal connecting section includes a first parallel section and a first tilt section, the first parallel section is configured to transmit the first component of the balance signal, one end of the first tilt section is connected to the first parallel section, and the other end is connected to the first impedance matching section; the second balance signal connecting section includes a second parallel section and a second tilt section, the second parallel section is parallel to the first parallel section, the second parallel section is configured to transmit the second component of the balance signal, one end of the second tilt section is connected to the second parallel section, and the other end is connected to the second impedance matching section; and the conductive ground includes a first reference ground and a second reference ground, the first reference ground is a reference ground of the first parallel section and the second parallel section, and the second reference ground is a reference ground of the first tilt section and the second tilt section. Impedance formed by the first parallel section, the second parallel section, and the first reference ground remains unchanged, and impedance formed by the first tilt section, the second tilt section, and the second reference ground is gradient, or impedance formed by the first parallel section, the second parallel section, and the first reference ground remains unchanged. Because the first parallel section and the second parallel section are configured to transmit the balance signal, the first parallel section and the second parallel section are made to be parallel to each other and have unchanged impedance, so that the first parallel section and the second parallel section have good electrical characteristics.

In a possible implementation, the first tilt section gradually approaches the second tilt section in a direction away from the first parallel section, and the second tilt section gradually approaches the first tilt section in a direction away from the second parallel section. This can facilitate winding of a magnetic ring, and can reduce a width of the balance-unbalance conversion apparatus.

In a possible implementation, a cross-sectional area of the first reference ground remains unchanged, and a cross-sectional area of the second reference ground is gradient. Therefore, gradient of the cross-sectional area of the second reference ground may also cause an impedance change, to implement a smooth impedance transition.

In a possible implementation, cross-sectional areas of the first parallel section and the second parallel section remain unchanged, and cross-sectional areas of the first tilt section and the second tilt section are gradient. Therefore, impedance may be changed by changing the cross-sectional areas of the first tilt section and the second tilt section, so that an implementation of a smooth impedance transition is more flexible.

In a possible implementation, a projection of the first impedance matching section on a plane on which the second impedance matching section is located may overlap the second impedance matching section. This can save space in a width direction.

In a possible implementation, a magnetic piece may be sleeved on at least a part of the first impedance matching section and at least a part of the second impedance matching section, so that an entire structure of the balance-unbalance conversion apparatus can have ultra-wideband performance and comparatively good low-frequency characteristics, for example, S11<−20 dB and S21>−3 dB in an entire frequency band range of concern.

In a possible implementation, a magnetic piece may be sleeved on the entire first impedance matching section and the entire second impedance matching section. Compared with sleeving a magnetic piece only on a part of the first impedance matching section and a part of the second impedance matching section, sleeving a magnetic piece on the entire first impedance matching section and the entire second impedance matching section can achieve better low-frequency characteristics. If more magnetic pieces are sleeved, S11<−20 dB can be satisfied at a lower frequency.

In a possible implementation, the magnetic piece may be made of one magnetic material, or may be made of two or more magnetic materials. Manufacturing the magnetic piece by jointly using a plurality of materials can further decrease S11.

In a possible implementation, a structure of the magnetic piece may include a magnetic coil, a hollow magnetic prism, a hollow magnetic cylinder, a hollow magnetic ellipse, or the like.

In a possible implementation, the magnetic piece may be alternatively formed by splicing at least two parts. This can facilitate installation of the magnetic piece.

In a possible implementation, the first microstrip and the second balance signal connecting section of the second microstrip are disposed on a first surface of the insulation substrate, the second impedance matching section and the ground section of the second microstrip are disposed on a second surface of the insulation substrate, the second balance signal connecting section and the second impedance matching section are connected through a conductive via that penetrates the first surface and the second surface of the insulation substrate, and the conductive ground is disposed on the second surface of the insulation substrate.

In a possible implementation, the insulation substrate includes a first insulation substrate and a second insulation substrate, the first balance signal connecting section of the first microstrip and the second balance signal connecting section of the second microstrip are disposed on a first surface of the first insulation substrate, the conductive ground is disposed on a second surface of the first insulation substrate, and the first surface of the first insulation substrate is opposite to the second surface of the first insulation substrate. The first impedance matching section and the unbalance signal connecting section of the first microstrip are disposed on a first surface of the second insulation substrate, and the second impedance matching section and the ground section of the second microstrip are disposed on a second surface of the second insulation substrate.

In a possible implementation, the first balance signal connecting section of the first microstrip and the second balance signal connecting section of the second microstrip extend to a first edge of the first insulation substrate, the first impedance matching section of the first microstrip and the second impedance matching section of the second microstrip extend to a second edge of the second insulation substrate, the first edge of the first insulation substrate is connected to the second edge of the second insulation substrate, the first balance signal connecting section is electrically connected to the first impedance matching section, and the second balance signal connecting section is electrically connected to the second impedance matching section.

In a possible implementation, a slot is provided at the first edge of the first insulation substrate, the slot is located between the first balance signal connecting section and the second balance signal connecting section, a first side wall of the slot is close to the first balance signal connecting section and is provided with a first conductive sheet connected to the first balance signal connecting section, a second side wall of the slot is close to the second balance signal connecting section and is provided with a second conductive sheet connected to the second balance signal connecting section, the second edge of the second insulation substrate is inserted into the slot, the first conductive sheet is welded to the first impedance matching section, and the second conductive sheet is welded to the second impedance matching section.

In a possible implementation, the first insulation substrate and the second insulation substrate are perpendicular to each other.

In a possible implementation, the first insulation substrate and the second insulation substrate are parallel to each other, the first edge and the second edge are superposed, the first balance signal connecting section is crimped to the first impedance matching section, and the second balance signal connecting section is welded to the second impedance matching section by using a welding joint.

In a possible implementation, the first balance signal connecting section and the second balance signal connecting section each are connected to a direct-current blocking capacitor, so that a signal that enters the first balance signal connecting section and the second balance signal connecting section may be an alternating-current signal without a direct-current component.

In a possible implementation, the first balance signal connecting section includes a first parallel section and a first tilt section, the first parallel section is configured to transmit the first component of the balance signal, one end of the first tilt section is connected to the first parallel section, and the other end is connected to the first impedance matching section; the second balance signal connecting section includes a second parallel section, the second microstrip further includes an impedance transition section, the impedance transition section and the second impedance matching section are located on a same plane, one end of the impedance transition section is connected to the second parallel section through a via, and the other end is connected to the second impedance matching section; the conductive ground includes a first reference ground, and the first reference ground is a reference ground of the first parallel section and the second parallel section; and impedance formed by the first tilt section and the impedance transition section remains unchanged and is the same as impedance formed by the first parallel section, the second parallel section, and the first reference ground, or impedance formed by the first tilt section and the impedance transition section is gradient, so that a smooth transition from the impedance formed by the first parallel section, the second parallel section, and the first reference ground to the impedance formed by the unbalance signal connecting section and the ground section is implemented. Therefore, a second reference ground may not be disposed, provided that the impedance formed by the first tilt section and the impedance transition section meets an impedance matching requirement.

In a possible implementation, because the first parallel section and the second parallel section have a reference ground, line widths of the first parallel section and the second parallel section may be made to be comparatively narrow. However, the first tilt section and the impedance transition section have no reference ground. Therefore, line widths of the first tilt section and the impedance transition section need to be fully used to match impedance. In this case, the line widths of the first tilt section and the impedance transition section need to be made to be comparatively wide, to match the impedance formed by the first parallel section, the second parallel section, and the first reference ground. In this case, a width of the first tilt section is greater than a width of the first parallel section, and a width of the impedance transition section is greater than a width of the second parallel section.

In a possible implementation, the first parallel section and the first tilt section may be connected by using a first pad, the second parallel section and an upper end of a via of the impedance transition section may be connected by using a second pad, and shapes of the first pad and the second pad may be randomly selected, for example, may be a circle, a rectangle, or a square, provided that an impedance requirement can be met. To be specific, the impedance formed by the first tilt section and the impedance transition section remains unchanged and is the same as the impedance formed by the first parallel section, the second parallel section, and the first reference ground, or the impedance formed by the first tilt section and the impedance transition section is gradient, so that a smooth transition from the impedance formed by the first parallel section, the second parallel section, and the first reference ground to the impedance formed by the unbalance signal connecting section and the ground section is implemented.

According to a second aspect, this application further provides a balance-unbalance conversion apparatus, including:

a first microstrip, where the first microstrip includes a first balance signal connecting section, a first impedance matching section, and an unbalance signal connecting section that are sequentially connected, the first balance signal connecting section is configured to transmit a first component of a balance signal, and the unbalance signal connecting section is configured to transmit an unbalance signal;

a second microstrip, where the second microstrip includes a second balance signal connecting section, a second impedance matching section, and a ground section that are sequentially connected, the second balance signal connecting section is configured to transmit a second component of the balance signal, and the ground section is configured to connect to a ground signal;

a conductive ground, where the conductive ground is a reference ground of the first balance signal connecting section and the second balance signal connecting section;

a first insulation substrate, where the first balance signal connecting section of the first microstrip and the second balance signal connecting section of the second microstrip are disposed on a first surface of the first insulation substrate, the conductive ground is disposed on a second surface of the first insulation substrate, and the first surface of the first insulation substrate is opposite to the second surface of the first insulation substrate; and a second insulation substrate, where the first impedance matching section and the unbalance signal connecting section of the first microstrip are disposed on a first surface of the second insulation substrate, and the second impedance matching section and the ground section of the second microstrip are disposed on a second surface of the second insulation substrate, where a cross-sectional area of at least a part of the first microstrip and/or at least a part of the second microstrip is gradient.

According to the balance-unbalance conversion apparatus provided in this embodiment of this application, a first component of a differential alternating-current signal (or referred to as a balance signal) is connected by using the first balance signal connecting section, a second component of the differential alternating-current signal is connected by using the second balance signal connecting section, and after the two parts of the differential signal separately pass through the first impedance matching section and the second impedance matching section, an unbalance signal port outputs a single-ended signal (or referred to as an unbalance signal), thereby converting the differential signal into the single-ended signal. Because the cross-sectional area of at least a part of the first microstrip and/or at least a part of the second microstrip is gradient, an impedance value may be adjusted, so that a smooth transition from impedance formed by the first balance signal connecting section, the second balance signal connecting section, and the conductive ground to impedance formed by the unbalance signal connecting section and the ground section is implemented. According to the balance-unbalance conversion apparatus provided in this embodiment of this application, a microstrip replaces a transmission line cable such as a coaxial cable or a twisted pair in the prior art to serve as a signal conductor. Therefore, the balance-unbalance conversion apparatus may be integrated on the first insulation substrate and the second insulation substrate, thereby eliminating complex cabling work, and reducing installation space and manufacturing costs.

In a possible implementation of the second aspect, the first balance signal connecting section of the first microstrip and the second balance signal connecting section of the second microstrip extend to a first edge of the first insulation substrate, the first impedance matching section of the first microstrip and the second impedance matching section of the second microstrip extend to a second edge of the second insulation substrate, the first edge of the first insulation substrate is connected to the second edge of the second insulation substrate, the first balance signal connecting section is electrically connected to the first impedance matching section, and the second balance signal connecting section is electrically connected to the second impedance matching section.

In a possible implementation of the second aspect, a slot is provided at the first edge of the first insulation substrate, the slot is located between the first balance signal connecting section and the second balance signal connecting section, a first side wall of the slot is close to the first balance signal connecting section and is provided with a first conductive sheet connected to the first balance signal connecting section, a second side wall of the slot is close to the second balance signal connecting section and is provided with a second conductive sheet connected to the second balance signal connecting section, the second edge of the second insulation substrate is inserted into the slot, the first conductive sheet is welded to the first impedance matching section, and the second conductive sheet is welded to the second impedance matching section.

In a possible implementation of the second aspect, the first insulation substrate and the second insulation substrate are perpendicular to each other.

In a possible implementation of the second aspect, the first insulation substrate and the second insulation substrate are parallel to each other, the first edge and the second edge are superposed, the first balance signal connecting section is crimped to the first impedance matching section, and the second balance signal connecting section is welded to the second impedance matching section by using a welding joint.

In a possible implementation of the second aspect, the first impedance matching section of the first microstrip is parallel to the second impedance matching section of the second microstrip.

In a possible implementation of the second aspect, a cross-sectional area of the first impedance matching section may gradually increase in a direction toward the unbalance signal connecting section, and a cross-sectional area of the second impedance matching section may gradually increase in a direction toward the ground section.

In a possible implementation of the second aspect, a cross-sectional area of the first impedance matching section may gradually decrease in a direction toward the unbalance signal connecting section, and a cross-sectional area of the second impedance matching section may gradually decrease in a direction toward the ground section.

In a possible implementation of the second aspect, a cross-sectional width of a microstrip may remain unchanged, and a cross-sectional thickness of the microstrip is gradient.

In a possible implementation of the second aspect, a cross-sectional thickness of a microstrip may remain unchanged, and a cross-sectional width of the microstrip is gradient. This solution can facilitate manufacturing of a gradient microstrip.

In a possible implementation of the second aspect, both a cross-sectional thickness of a microstrip and a cross-sectional width of the microstrip may be gradient.

In a possible implementation of the second aspect, the first balance signal connecting section includes a first parallel section and a first tilt section, the first parallel section is configured to transmit the first component of the balance signal, one end of the first tilt section is connected to the first parallel section, and the other end is connected to the first impedance matching section; the second balance signal connecting section includes a second parallel section and a second tilt section, the second parallel section is parallel to the first parallel section, the second parallel section is configured to transmit the second component of the balance signal, one end of the second tilt section is connected to the second parallel section, and the other end is connected to the second impedance matching section; and the conductive ground includes a first reference ground and a second reference ground, the first reference ground is a reference ground of the first parallel section and the second parallel section, and the second reference ground is a reference ground of the first tilt section and the second tilt section. Impedance formed by the first parallel section, the second parallel section, and the first reference ground remains unchanged, and impedance formed by the first tilt section, the second tilt section, and the second reference ground is gradient. Because the first parallel section and the second parallel section are configured to transmit the balance signal, the first parallel section and the second parallel section are made to be parallel to each other and have unchanged impedance, so that the first parallel section and the second parallel section have good electrical characteristics.

In a possible implementation of the second aspect, the first tilt section gradually approaches the second tilt section in a direction away from the first parallel section, and the second tilt section gradually approaches the first tilt section in a direction away from the second parallel section. This can facilitate winding of a magnetic ring, and can reduce a width of the balance-unbalance conversion apparatus.

In a possible implementation of the second aspect, a cross-sectional area of the first reference ground remains unchanged, and a cross-sectional area of the second reference ground is gradient. Therefore, gradient of the cross-sectional area of the second reference ground may also cause an impedance change, to implement a smooth impedance transition.

In a possible implementation of the second aspect, cross-sectional areas of the first parallel section and the second parallel section remain unchanged, and cross-sectional areas of the first tilt section and the second tilt section are gradient. Therefore, impedance may be changed by changing the cross-sectional areas of the first tilt section and the second tilt section, so that an implementation of a smooth impedance transition is more flexible.

In a possible implementation of the second aspect, a projection of the first impedance matching section on a plane on which the second impedance matching section is located may overlap the second impedance matching section. This can save space in a width direction.

In a possible implementation of the second aspect, a magnetic piece may be sleeved on at least a part of the first impedance matching section and at least a part of the second impedance matching section, so that an entire structure of the balance-unbalance conversion apparatus can have ultra-wideband performance and comparatively good low-frequency characteristics, for example, S11<−20 dB and S21>−3 dB in an entire frequency band range of concern.

In a possible implementation of the second aspect, a magnetic piece may be sleeved on the entire first impedance matching section and the entire second impedance matching section. Compared with sleeving a magnetic piece only on a part of the first impedance matching section and a part of the second impedance matching section, sleeving a magnetic piece on the entire first impedance matching section and the entire second impedance matching section can achieve better low-frequency characteristics. If more magnetic pieces are sleeved, S11<−20 dB can be satisfied at a lower frequency.

In a possible implementation of the second aspect, the magnetic piece may be made of one magnetic material, or may be made of two or more magnetic materials. Manufacturing the magnetic piece by jointly using a plurality of materials can further decrease S11.

In a possible implementation of the second aspect, a structure of the magnetic piece may include a magnetic coil, a hollow magnetic prism, a hollow magnetic cylinder, a hollow magnetic ellipse, or the like.

In a possible implementation of the second aspect, the magnetic piece may be alternatively formed by splicing at least two parts. This can facilitate installation of the magnetic piece.

In a possible implementation of the second aspect, the first microstrip and the second balance signal connecting section of the second microstrip are disposed on a first surface of the insulation substrate, the second impedance matching section and the ground section of the second microstrip are disposed on a second surface of the insulation substrate, the second balance signal connecting section and the second impedance matching section are connected through a conductive via that penetrates the first surface and the second surface of the insulation substrate, and the conductive ground is disposed on the second surface of the insulation substrate.

In a possible implementation of the second aspect, the first balance signal connecting section and the second balance signal connecting section each are connected to a direct-current blocking capacitor, so that a signal that enters the first balance signal connecting section and the second balance signal connecting section may be an alternating-current signal without a direct-current component.

In a possible implementation of the second aspect, the first balance signal connecting section includes a first parallel section and a first tilt section, the first parallel section is configured to transmit the first component of the balance signal, one end of the first tilt section is connected to the first parallel section, and the other end is connected to the first impedance matching section; the second balance signal connecting section includes a second parallel section, the second microstrip further includes an impedance transition section, the impedance transition section and the second impedance matching section are located on a same plane, one end of the impedance transition section is connected to the second parallel section through a via, and the other end is connected to the second impedance matching section; the conductive ground includes a first reference ground, and the first reference ground is a reference ground of the first parallel section and the second parallel section, and impedance formed by the first tilt section and the impedance transition section remains unchanged and is the same as impedance formed by the first parallel section, the second parallel section, and the first reference ground, or impedance formed by the first tilt section and the impedance transition section is gradient, so that a smooth transition from the impedance formed by the first parallel section, the second parallel section, and the first reference ground to the impedance formed by the unbalance signal connecting section and the ground section is implemented. Therefore, a second reference ground may not be disposed, provided that the impedance formed by the first tilt section and the impedance transition section meets an impedance matching requirement.

In a possible implementation of the second aspect, because the first parallel section and the second parallel section have a reference ground, line widths of the first parallel section and the second parallel section may be made to be comparatively narrow. However, the first tilt section and the impedance transition section have no reference ground. Therefore, line widths of the first tilt section and the impedance transition section need to be fully used to match impedance. In this case, the line widths of the first tilt section and the impedance transition section need to be made to be comparatively wide, to match the impedance formed by the first parallel section, the second parallel section, and the first reference ground. In this case, a width of the first tilt section is greater than a width of the first parallel section, and a width of the impedance transition section is greater than a width of the second parallel section.

In a possible implementation of the second aspect, the first parallel section and the first tilt section may be connected by using a first pad, the second parallel section and an upper end of a via of the impedance transition section may be connected by using a second pad, and shapes of the first pad and the second pad may be randomly selected, for example, may be a circle, a rectangle, or a square, provided that an impedance requirement can be met. To be specific, the impedance formed by the first tilt section and the impedance transition section remains unchanged and is the same as the impedance formed by the first parallel section, the second parallel section, and the first reference ground, or the impedance formed by the first tilt section and the impedance transition section is gradient, so that a smooth transition from the impedance formed by the first parallel section, the second parallel section, and the first reference ground to the impedance formed by the unbalance signal connecting section and the ground section is implemented.

According to a third aspect, this application further provides a communications device, including a circuit board, where an integrated circuit and at least one balance-unbalance conversion apparatus are disposed on the circuit board, and the balance-unbalance conversion apparatus is the balance-unbalance conversion apparatus in any embodiment of the first aspect or the second aspect.

In a possible implementation of the third aspect, the integrated circuit includes a first balance signal port and a second balance signal port, where the first balance signal port is connected to a first balance signal connecting section of the balance-unbalance conversion apparatus, and the second balance signal port is connected to a second balance signal connecting section of the balance-unbalance conversion apparatus.

According to a fourth aspect, this application further provides a communications system, including a first communications device and a second communications device, where both the first communications device and the second communications device are the communications device in any implementation of the third aspect, and a balance-unbalance conversion apparatus of the first communications device is connected to a balance-unbalance conversion apparatus of the second communications device.

In a possible implementation of the fourth aspect, the balance-unbalance conversion apparatus of the first communications device and the balance-unbalance conversion apparatus of the second communications device are connected by using a coaxial transmission line.

In a possible implementation of the fourth aspect, the first communications device includes a first chip and a first balance-unbalance conversion apparatus, the second communications device includes a second chip and a second balance-unbalance conversion apparatus, the first chip is configured to output a balance signal, the second chip is configured to receive the balance signal, the first balance-unbalance conversion apparatus is configured to convert the balance signal output by the first chip into an unbalance signal and transmit the unbalance signal to the second balance-unbalance conversion apparatus, and the second balance-unbalance conversion apparatus is configured to convert the unbalance signal into a balance signal and transmit the balance signal to the second chip. A signal may be transmitted between the second balance-unbalance conversion apparatus and the second chip by using a coaxial transmission line.

In the communications system provided in this application, a coaxial transmission line may be used for a connection, and has advantages of a higher density, higher electrical performance, more flexible winding, and lower costs compared with a biaxial cable.

DESCRIPTION OF EMBODIMENTS

Embodiments of this application relate to a balance-unbalance converter, a communications device, and a communications system. The following briefly describes concepts in the foregoing embodiments:

A balance-unbalance converter, also referred to as a balun, is configured to convert a balance signal into an unbalance signal or convert an unbalance signal into a balance signal.

Impedance: In a circuit with a resistor, an inductor, and a capacitor, a hindering effect against a current in the circuit is referred to as impedance.

Figure 1:
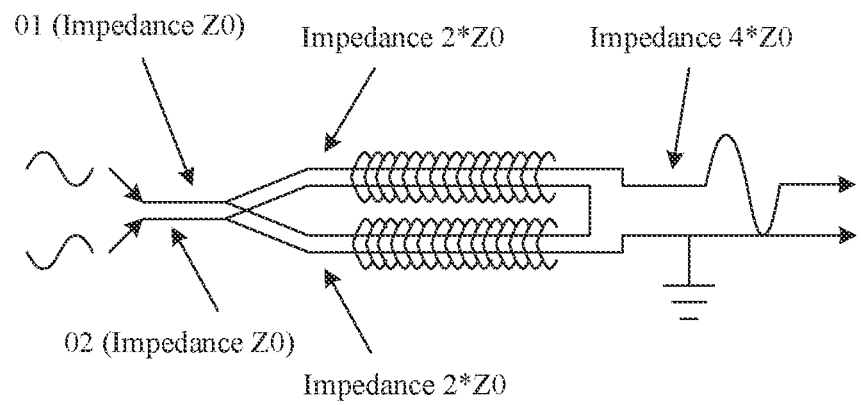
FIG. 1 is a structural diagram of a balun.
Figure 2:
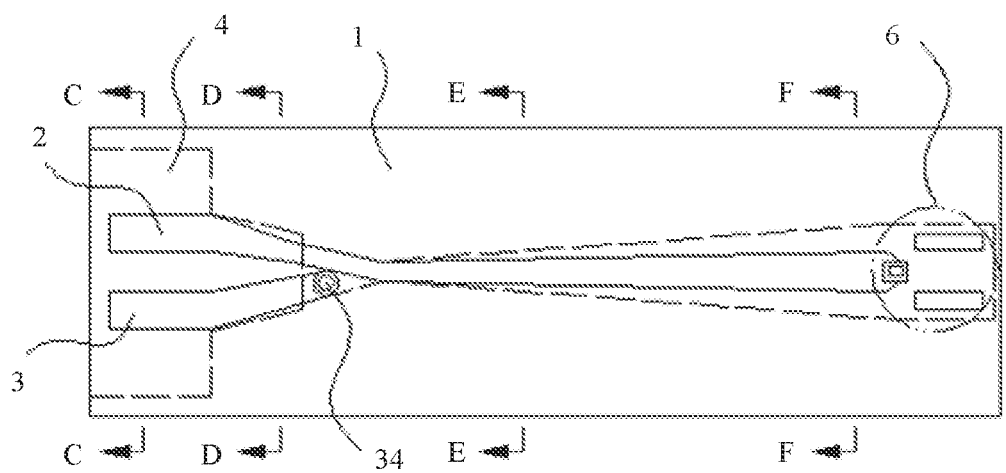
FIG. 2 is a schematic structural diagram of a balance-unbalance conversion apparatus according to an embodiment of this application.
Figure 3:
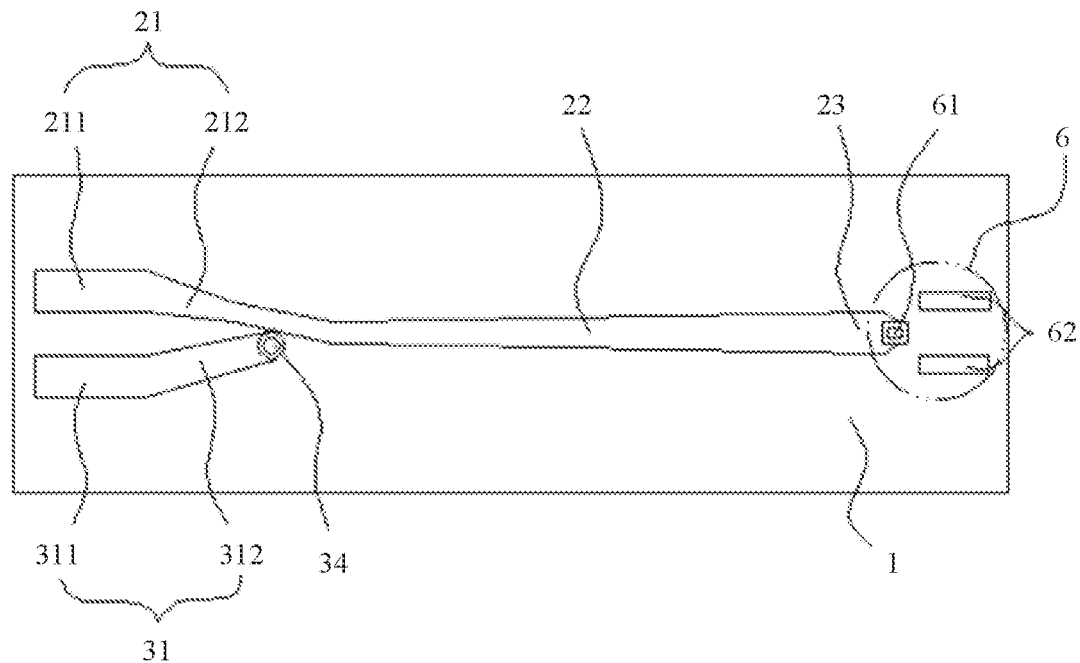
FIG. 3 is a schematic structural diagram of a first surface of a balance-unbalance conversion apparatus according to an embodiment of this application.
Figure 4:
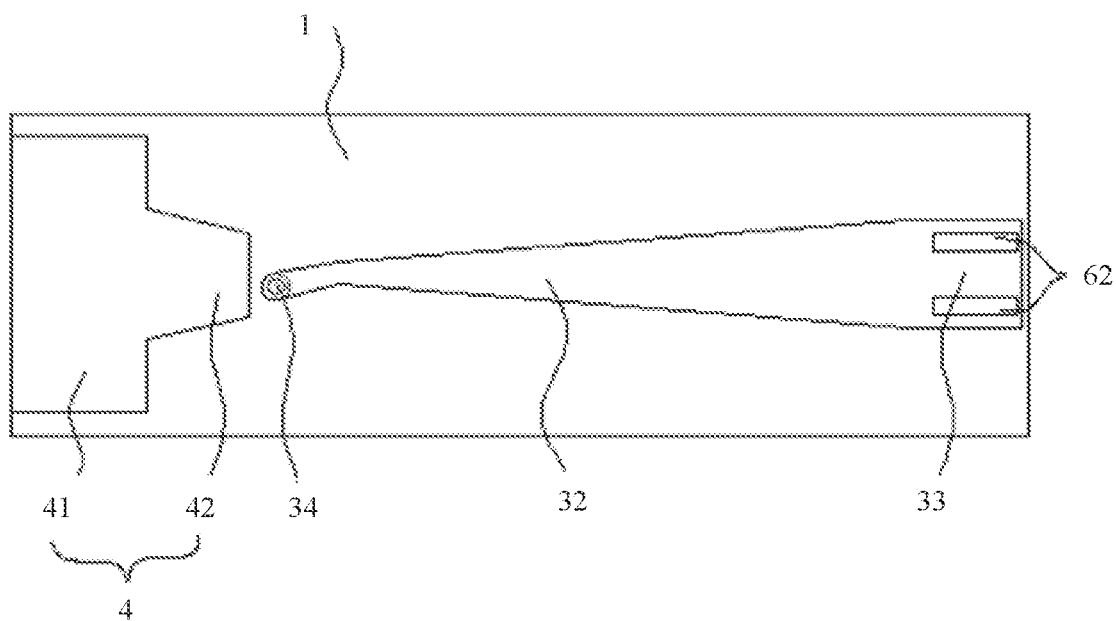
FIG. 4 is a schematic structural diagram of a second surface of a balance-unbalance conversion apparatus according to an embodiment of this application.

As shown in FIG. 2, an embodiment of this application provides a balance-unbalance conversion apparatus, including an insulation substrate 1, a first microstrip 2, a second microstrip 3, and a conductive ground 4. As shown in FIG. 3, the first microstrip 2 includes a first balance signal connecting section 21, a first impedance matching section 22, and an unbalance signal connecting section 23 that are sequentially connected. The first balance signal connecting section 21 is configured to transmit a first component of a balance signal, and the unbalance signal connecting section 23 is configured to transmit an unbalance signal. As shown in FIG. 3 and FIG. 4, the second microstrip 3 includes a second balance signal connecting section 31, a second impedance matching section 32, and a ground section 33 that are sequentially connected. The second balance signal connecting section 31 is configured to transmit a second component of the balance signal, and the ground section 33 is configured to connect to a ground signal. The conductive ground 4 is a reference ground of the first balance signal connecting section 21 and the second balance signal connecting section 31. The first microstrip 2, the second microstrip 3, and the conductive ground 4 are all disposed on the insulation substrate 1. The first balance signal connecting section 21 of the first microstrip 2 and the second balance signal connecting section 31 of the second microstrip 3 are located on a same plane of the insulation substrate 1. The first impedance matching section 22 of the first microstrip 2 and the second impedance matching section 32 of the second microstrip 3 are separated by the insulation substrate 1. A cross-sectional area of at least a part of the first microstrip 2 and/or at least a part of the second microstrip 3 is gradient, so that a smooth transition from impedance formed by the first balance signal connecting section 21, the second balance signal connecting section 31, and the conductive ground 4 to impedance formed by the unbalance signal connecting section 23 and the ground section 33 is implemented.

According to the balance-unbalance conversion apparatus provided in this embodiment of this application, a first component of a differential alternating-current signal (or referred to as a balance signal) is connected by using the first balance signal connecting section 21, a second component of the differential alternating-current signal is connected by using the second balance signal connecting section 31, and after the two parts of the differential signal separately pass through the first impedance matching section 22 and the second impedance matching section 32, an unbalance signal port outputs a single-ended signal (or referred to as an unbalance signal), thereby converting the differential signal into the single-ended signal. Because the cross-sectional area of at least a part of the first microstrip 2 and/or at least a part of the second microstrip 3 is gradient, an impedance value may be adjusted, so that a smooth transition from impedance formed by the first balance signal connecting section 21, the second balance signal connecting section 31, and the conductive ground 4 to impedance formed by the unbalance signal connecting section 23 and the ground section 33 is implemented. In addition, the first balance signal connecting section 21 and the second balance signal connecting section 31 are located on a same plane of the insulation substrate 1, thereby facilitating a connection between the balance-unbalance conversion apparatus and another electrical device (for example, Serdes). According to the balance-unbalance conversion apparatus provided in this embodiment of this application, a microstrip replaces a transmission line cable such as a coaxial cable or a twisted pair in the prior art to serve as a signal conductor. Therefore, the balance-unbalance conversion apparatus may be integrated on a substrate (for example, a PCB board), thereby eliminating complex cabling work, and reducing installation space and manufacturing costs.

It should be noted that, although an area of the conductive ground 4 is smaller than an area of the insulation substrate 1 in FIG. 2, in an actual application process, the area of the conductive ground 4 may be equal to or different from the area of the insulation substrate 1. This is not limited herein.

When a microwave signal is being transmitted, transmission and reflection may occur if the microwave signal encounters an impedance catastrophe point. However, if impedance is changed to a gradient transition, a total signal energy transmittance can be increased, and a reflectivity can be decreased. Gradient of the impedance may be implemented by changing a cross-sectional area of a microstrip. For example, a cross-sectional area of at least a part of the first microstrip 2 may be gradient, or a cross-sectional area of at least a part of the second microstrip 3 is gradient, or both a cross-sectional area of at least a part of the first microstrip 2 and a cross-sectional area of at least a part of the second microstrip 3 may be gradient, thereby implementing a gradient transition of impedance, and finally implementing a smooth transition from impedance formed by the first balance signal connecting section 21, the second balance signal connecting section 31, and the conductive ground 4 to impedance formed by the unbalance signal connecting section 23 and the ground section 33. In addition, with the smooth impedance transition solution, a total signal energy transmittance can be increased, and a reflectivity can be decreased.

It should be noted that the cross-sectional area is gradient means that a change process of the cross-sectional area is smooth, without an obvious change step. Correspondingly, the smooth impedance transition may mean that an impedance change process is smooth, without an obvious change step. For example, if the impedance formed by the first balance signal connecting section 21, the second balance signal connecting section 31, and the conductive ground 4 is 100Ω, after going through the gradient cross-sectional area of at least a part of the first microstrip 2 and/or at least a part of the second microstrip 3, the impedance gradually and smoothly changes from 100Ω to 50Ω formed by the unbalance signal connecting section 23 and the ground section 33. During changing from 100Ω to 50Ω, an impedance change process is smooth, and a change degree is uniform, without an obvious change step.

In the foregoing embodiment in which the impedance smooth transition is implemented by changing a cross-sectional area of a microstrip, if the impedance formed by the first balance signal connecting section 21, the second balance signal connecting section 31, and the conductive ground 4 is greater than the impedance formed by the unbalance signal connecting section 23 and the ground section 33, a cross-sectional area of the first impedance matching section 22 may gradually increase in a direction toward the unbalance signal connecting section 23, so that impedance formed between the first impedance matching section 22 and the second impedance matching section 32 gradually decreases in a direction toward the unbalance signal connecting section 23; and a cross-sectional area of the second impedance matching section 32 gradually increases in a direction toward the ground section 33, so that impedance formed between the first impedance matching section 22 and the second impedance matching section 32 gradually decreases in a direction toward the ground section 33. Likewise, if the impedance formed by the first balance signal connecting section 21, the second balance signal connecting section 31, and the conductive ground 4 is less than the impedance formed by the unbalance signal connecting section 23 and the ground section 33, a cross-sectional area of the first impedance matching section 22 may gradually decrease in a direction toward the unbalance signal connecting section 23, so that impedance formed between the first impedance matching section 22 and the second impedance matching section 32 gradually increases in a direction toward the unbalance signal connecting section 23; and a cross-sectional area of the second impedance matching section 32 may gradually decrease in a direction toward the ground section 33, so that impedance formed between the first impedance matching section 22 and the second impedance matching section 32 gradually increases in a direction toward the ground section 33. This can implement a smooth transition from the impedance formed by the first balance signal connecting section 21, the second balance signal connecting section 31, and the conductive ground 4 to the impedance formed by the unbalance signal connecting section 23 and the ground section 33.

Figure 7:
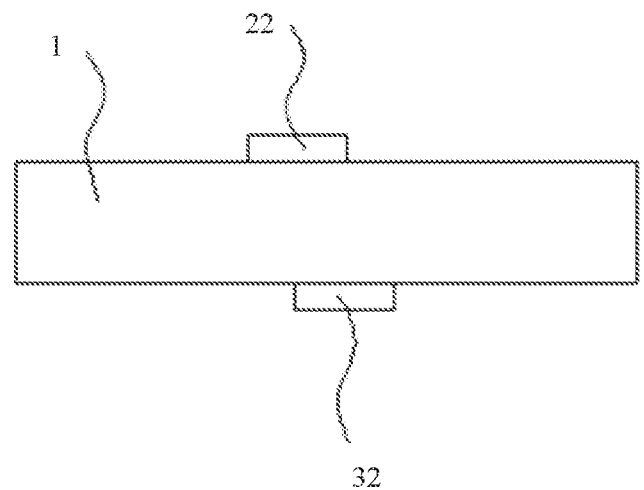
FIG. 7 is an E-E sectional view of FIG. 2.
Figure 8:
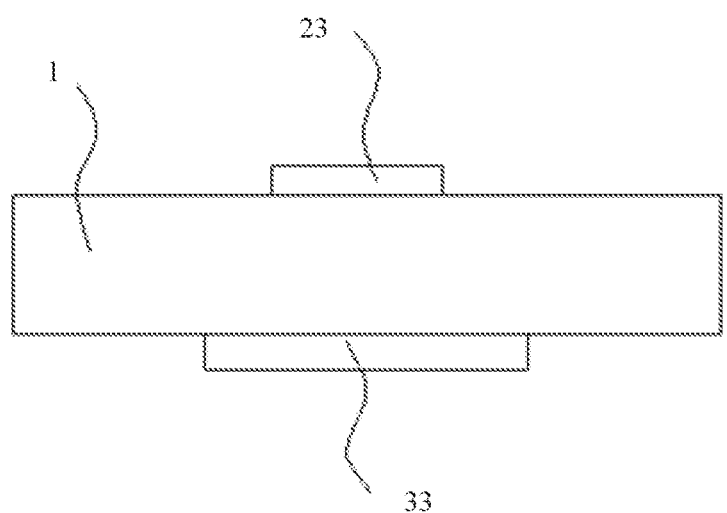
FIG. 8 is an F-F sectional view of FIG. 2.

To implement gradient of a cross-sectional area of a microstrip, there may be a plurality of implementation solutions. For example, a cross-sectional width of the microstrip may remain unchanged, and a cross-sectional thickness of the microstrip is gradient; or a cross-sectional thickness of the microstrip may remain unchanged, and a cross-sectional width of the microstrip is gradient; or both a cross-sectional thickness of the microstrip and a cross-sectional width of the microstrip may be gradient. Specifically, as shown in FIG. 3, FIG. 7, and FIG. 8, a cross-sectional thickness of the first impedance matching section 22 may remain unchanged, and a cross-sectional width of the first impedance matching section 22 gradually increases in a direction toward the unbalance signal connecting section 23, so that the cross-sectional area of the first impedance matching section 22 gradually increases in a direction toward the unbalance signal connecting section 23. As shown in FIG. 4, FIG. 7, and FIG. 8, a cross-sectional thickness of the second impedance matching section 32 may remain unchanged, and a cross-sectional width of the second impedance matching section 32 gradually increases in a direction toward the ground section 33, so that the cross-sectional area of the second impedance matching section 32 gradually increases in a direction toward the ground section 33. A width of a microstrip may be tailored as required, but it is difficult to change a thickness. Therefore, a cross-sectional thickness of the microstrip remains unchanged, and a cross-sectional width of the microstrip is gradient, thereby facilitating manufacturing of a gradient microstrip.

In an implementation of this application, as shown in FIG. 3, the first balance signal connecting section 21 may include a first parallel section 211 and a first tilt section 212, where the first parallel section 211 is configured to transmit the first component of the balance signal, one end of the first tilt section 212 is connected to the first parallel section 211, and the other end is connected to the first impedance matching section 22; the second balance signal connecting section 31 includes a second parallel section 311 and a second tilt section 312, where the second parallel section 311 is parallel to the first parallel section 211, the second parallel section 311 is configured to transmit the second component of the balance signal, one end of the second tilt section 312 is connected to the second parallel section 311, and the other end is connected to the second impedance matching section 32. As shown in FIG. 4, the conductive ground 4 includes a first reference ground 41 and a second reference ground 42, where the first reference ground 41 is a reference ground of the first parallel section 211 and the second parallel section 311, and the second reference ground 42 is a reference ground of the first tilt section 212 and the second tilt section 312. In this case, to implement a smooth impedance transition, impedance formed by the first parallel section 211, the second parallel section 311, and the first reference ground 41 may remain unchanged, and impedance formed by the first tilt section 212, the second tilt section 312, and the second reference ground 42 is gradient. Because the first parallel section 211 and the second parallel section 311 are configured to transmit the balance signal, the first parallel section 211 and the second parallel section 311 are made to be parallel to each other and have unchanged impedance, so that the first parallel section 211 and the second parallel section 311 have good electrical characteristics.

The first tilt section 212 gradually approaches the second tilt section 312 in a direction away from the first parallel section 211, and the second tilt section 312 gradually approaches the first tilt section 212 in a direction away from the second parallel section 311. Therefore, the first tilt section 212 and the second tilt section 312 gradually approach each other, so that a via is subsequently provided and the first impedance matching section 22 and the second impedance matching section 32 are connected. In addition, after the first tilt section 212 and the second tilt section 312 gradually approach each other, the first impedance matching section 22 and the second impedance matching section 32 may occupy smaller space in a width direction. This can facilitate winding of a magnetic ring, and can reduce a width of the balance-unbalance conversion apparatus.

Gradient of the impedance formed by the first tilt section 212, the second tilt section 312, and the second reference ground 42 may be implemented by changing cross-sectional areas of the first tilt section 212 and the second tilt section 312. For example, cross-sectional areas of the first parallel section 211 and the second parallel section 311 may remain unchanged, and cross-sectional areas of the first tilt section 212 and the second tilt section 312 are gradient.

Figure 5:
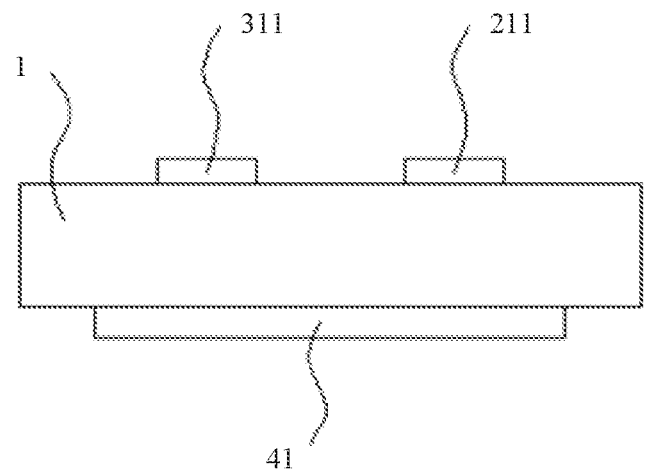
FIG. 5 is a C-C sectional view of FIG. 2.
Figure 6:
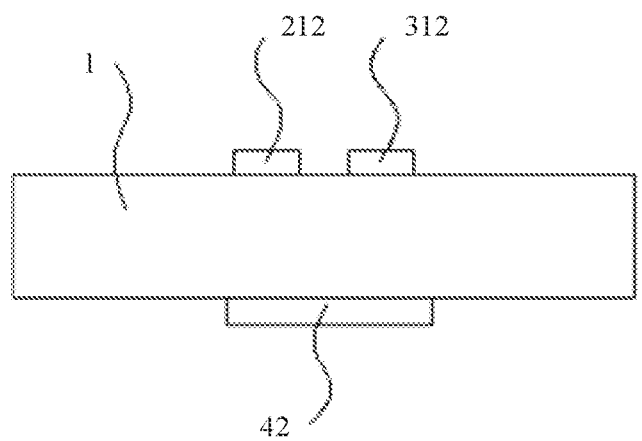
FIG. 6 is a D-D sectional view of FIG. 2.

Parameters such as a cross-sectional area, a spacing, and a relative position of each microstrip and the conductive ground 4 may affect impedance. Therefore, in a possible implementation, gradient of the impedance formed by the first tilt section 212, the second tilt section 312, and the second reference ground 42 may be implemented by changing cross-sectional areas of the first tilt section 212 and the second tilt section 312. For example, cross-sectional areas of the first parallel section 211 and the second parallel section 311 may remain unchanged, and the cross-sectional areas of the first tilt section 212 and the second tilt section 312 are gradient. In another possible implementation, the gradient of the impedance may be alternatively implemented by changing a cross-sectional area of the conductive ground 4. As shown in FIG. 4, FIG. 5, and FIG. 6, a cross-sectional area of the first reference ground 41 remains unchanged, and a cross-sectional area of the second reference ground 42 is gradient. Therefore, gradient of the cross-sectional area of the second reference ground 42 may also cause an impedance change, to implement a smooth impedance transition.

Figure 21:
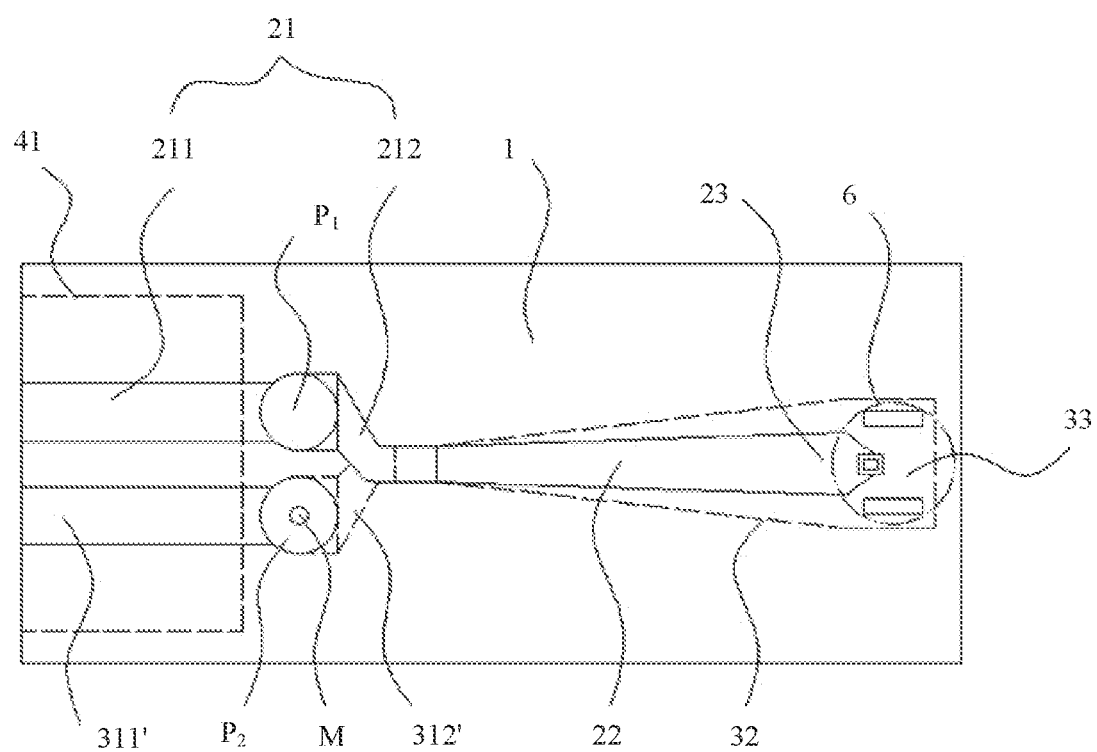
FIG. 21 is a schematic structural diagram of a balance-unbalance conversion apparatus without a second reference ground according to an embodiment of this application.

In another possible implementation, alternatively, the second reference ground 42 may not be disposed. A specific structure is shown in FIG. 21. The first balance signal connecting section 21 includes a first parallel section 211 and a first tilt section 212, where the first parallel section is configured to transmit the first component of the balance signal, one end of the first tilt section 212 is connected to the first parallel section 211, and the other end is connected to the first impedance matching section 22. The second balance signal connecting section includes a second parallel section 311', the second microstrip further includes an impedance transition section 312', the impedance transition section 312' and the second impedance matching section 32 are located on a same plane, one end of the impedance transition section 312' is connected to the second parallel section 311' through a via H, and the other end is connected to the second impedance matching section 32. The conductive ground includes only a first reference ground 41, and the first reference ground 41 is a reference ground of the first parallel section 211 and the second parallel section 311'. Impedance formed by the first tilt section 212 and the impedance transition section 312' remains unchanged and is the same as impedance formed by the first parallel section 211, the second parallel section 311', and the first reference ground 41, or impedance formed by the first tilt section 212 and the impedance transition section 312' is gradient, so that a smooth transition from the impedance formed by the first parallel section 211, the second parallel section 311', and the first reference ground 41 to the impedance formed by the unbalance signal connecting section 23 and the ground section 33 is implemented. Therefore, a second reference ground may not be disposed, provided that the impedance formed by the first tilt section 212 and the impedance transition section 312' meets the foregoing impedance matching requirement.

In the foregoing embodiment, as shown in FIG. 21, because the first parallel section 211 and the second parallel section 311' have the first reference ground 41, line widths of the first parallel section 211 and the second parallel section 311' may be made to be comparatively narrow. However, the first tilt section 212 and the impedance transition section 312' have no reference ground. Therefore, line widths of the first tilt section 212 and the impedance transition section 312' need to be fully used to match impedance. In this case, the line widths of the first tilt section 212 and the impedance transition section 312' need to be made to be comparatively wide, to match the impedance formed by the first parallel section 211, the second parallel section 311', and the first reference ground 41. In this case, a width of the first tilt section 212 is greater than a width of the first parallel section 211, and a width of the impedance transition section 312' is greater than a width of the second parallel section 311'.

Specifically, as shown in FIG. 21, the first parallel section 211 and the first tilt section 212 may be connected by using a first pad $P_1$, the second parallel section 311' and an upper end of a via of the impedance transition section 312' may be connected by using a second pad $P_2$, and shapes of the first pad $P_1$ and the second pad $P_2$ may be randomly selected, for example, may be a circle, a rectangle, or a square, provided that an impedance requirement can be met. To be specific, the impedance formed by the first tilt section 212 and the impedance transition section 312' remains unchanged and is the same as the impedance formed by the first parallel section 211, the second parallel section 311', and the first reference ground 41, or the impedance formed by the first tilt section 212 and the impedance transition section 312' is gradient, so that a smooth transition from the impedance formed by the first parallel section 211, the second parallel section 311', and the first reference ground 41 to the impedance formed by the unbalance signal connecting section 23 and the ground section 33 is implemented.

To save space, a projection of the first impedance matching section 22 on a plane on which the second impedance matching section 32 is located may overlap the second impedance matching section 32. In other words, positions of the first impedance matching section 22 and the second impedance matching section 32 overlap each other in a thickness direction of the insulation substrate 1. This can save space in a width direction. It should be noted that the overlapping merely means position overlapping, and widths of the first impedance matching section 22 and the second impedance matching section 32 may be the same or different. This is not limited herein. It should be noted that, when arrangement space allows, the projection of the first impedance matching section 22 on the plane on which the second impedance matching section 32 is located may alternatively not overlap the second impedance matching section 32, provided that an expected impedance transition can be implemented.

Figure 9:
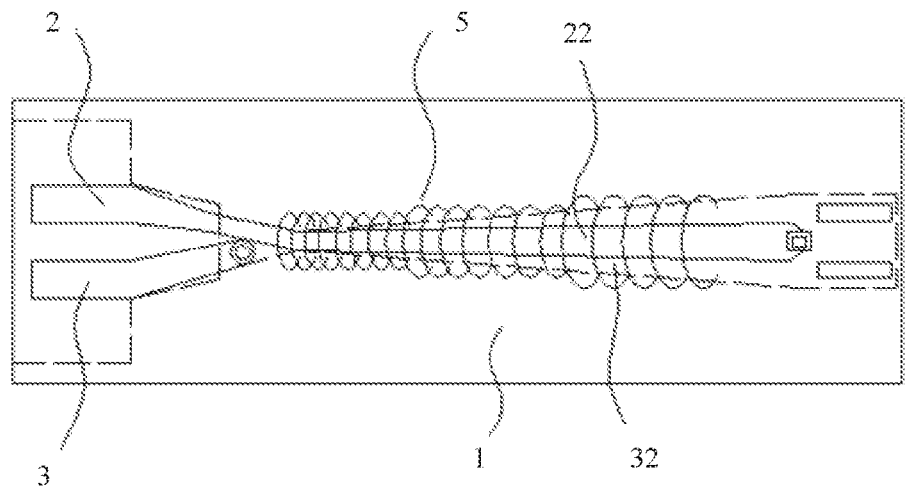
FIG. 9 is a schematic structural diagram of a balance-unbalance conversion apparatus in which a magnetic piece is disposed according to an embodiment of this application.

To make a parameter S11 meet a signal transmission requirement at a low frequency to obtain comparatively good low-frequency characteristics, as shown in FIG. 9, a magnetic piece 5 may be sleeved on at least a part of the first impedance matching section 22 and at least a part of the second impedance matching section 32, and the magnetic piece 5 is not in contact with either the first impedance matching section 22 or the second impedance matching section 32, so that an entire structure of the balance-unbalance conversion apparatus can have ultra-wideband performance and comparatively good low-frequency characteristics, for example, S11<−20 dB and S21>−3 dB in an entire frequency band range of concern.

The magnetic piece 5 may be made of one magnetic material, or may be made of two or more magnetic materials. This is not limited herein. Manufacturing the magnetic piece by jointly using a plurality of materials can further decrease S11. A type and distribution of a specific magnetic material for winding may be determined based on an actual situation.

Figure 10:
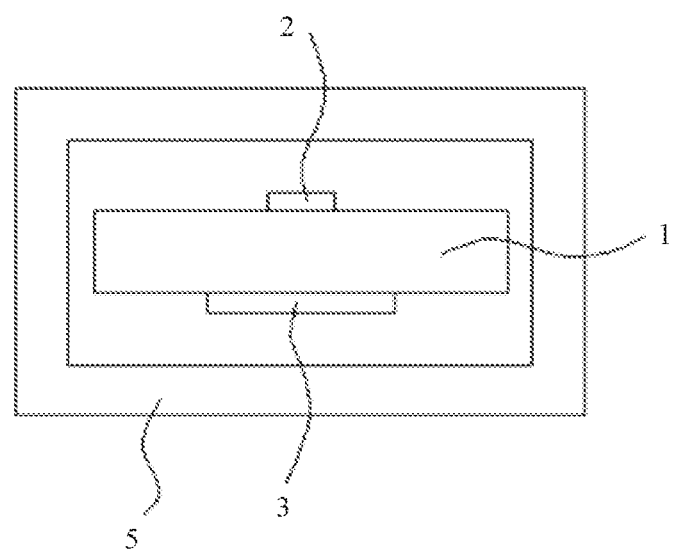
FIG. 10 is a schematic structural diagram when a magnetic piece is a hollow magnetic quadrangular prism.

For example, a structure of the magnetic piece 5 may include a magnetic coil, a hollow magnetic prism, a hollow magnetic cylinder, or a hollow magnetic ellipse. As shown in FIG. 10, the structure of the magnetic piece 5 may be a hollow magnetic prism structure.

Figure 11:
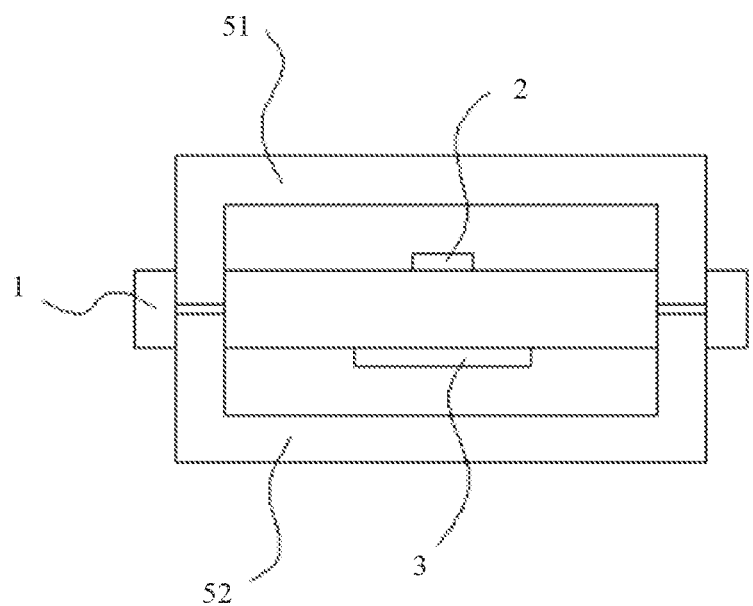
FIG. 11 is a schematic structural diagram when a magnetic piece is obtained by splicing two parts.

The magnetic piece 5 may surround a length range of the entire first impedance matching section 22 and the entire second impedance matching section 32, or may surround only a part of the first impedance matching section 22 and a part of the second impedance matching section 32. This is not limited herein. A larger length of the magnetic piece 5 contributes to better low-frequency characteristics. If more magnetic pieces are sleeved, S11<−20 dB can be satisfied at a lower frequency. For example, for a 2 cm-long balance-unbalance conversion apparatus, when no magnetic piece is disposed, S11>−20 dB in a frequency range below 3.5 GHz. When a magnetic piece is used for partial winding, S11>−20 dB within a range of 2 GHz. and S11<−20 dB at a frequency above 2 GHz. When more magnetic rings are used for winding, it is likely that S11<−20 dB can be satisfied at a frequency above 0.5 GHz. Therefore, a frequency band range of concern determines a quantity of magnetic rings for winding. In addition, for ease of installation, as shown in FIG. 11, the magnetic piece 5 may be alternatively formed by splicing at least two parts (51 and 52).

Optionally, the insulation substrate 1 may include one substrate or two substrates. When the insulation substrate 1 includes one substrate, as shown in FIG. 2, FIG. 3, and FIG. 4, the first microstrip 2 and the second balance signal connecting section 31 of the second microstrip 3 are disposed on a first surface of the insulation substrate 1, the second impedance matching section 32 and the ground section 33 of the second microstrip 3 are disposed on a second surface of the insulation substrate 1, the second balance signal connecting section 31 and the second impedance matching section 32 are connected through a conductive via 34 that penetrates the first surface and the second surface of the insulation substrate 1, and the conductive ground 4 is disposed on the second surface of the insulation substrate 1. Because the conductive ground 4 is a reference ground of the first balance signal connecting section 21 and the second balance signal connecting section 31, projections of the first balance signal connecting section 21 and the second balance signal connecting section 31 on the second surface fall within a range of the conductive ground 4. This can implement an inter-layer connection between the second balance signal connecting section 31 and the second impedance matching section 32 through the conductive via 34.

Figure 12:
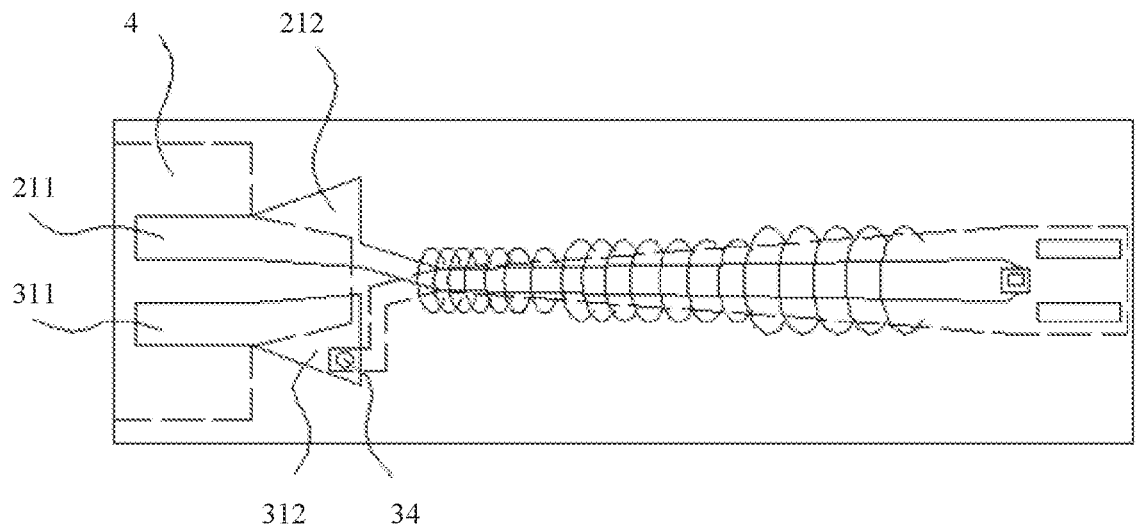
FIG. 12 is a schematic diagram when a first tilt section and a second tilt section are of a trapezoidal structure.

Specifically, the conductive via 34 may be provided in correspondence to the second tilt section 312 of the second balance signal connecting section 31. To be specific, one end of the conductive via 34 is connected to the second balance signal connecting section 31, and the other end is connected to the second tilt section 312. The first tilt section 212 and the second tilt section 312 may be alternatively of another shape, for example, a trapezoidal structure shown in FIG. 12. Any structure may be used, provided that a via can be implemented, and impedance matching can be achieved before and after the via is implemented.

To transmit a single-ended signal through a coaxial line, a coaxial line pad 6 may be disposed on the insulation substrate 1. As shown in FIG. 3, a core wire connecting port 61 for the coaxial line pad 6 is disposed on the first surface of the insulation substrate 1. As shown in FIG. 4, an outer metal connecting port 62 for the coaxial line pad 6 is disposed on the second surface of the insulation substrate 1. The outer metal connecting port 62 may penetrate the first surface and the second surface of the insulation substrate 1. For example, the outer metal connecting port 62 may be a metal conductor that penetrates the first surface and the second surface of the insulation substrate 1. The unbalance signal connecting section 23 of the first microstrip 2 is connected to the core wire connecting port 61 of the coaxial line pad, and the ground section 33 of the second microstrip 3 is short-circuited with the outer metal connecting port 62 of the coaxial line pad. This can convert an inter-plane differential signal into a single-ended signal, and can output the single-ended signal through the coaxial transmission line.

Figure 20:
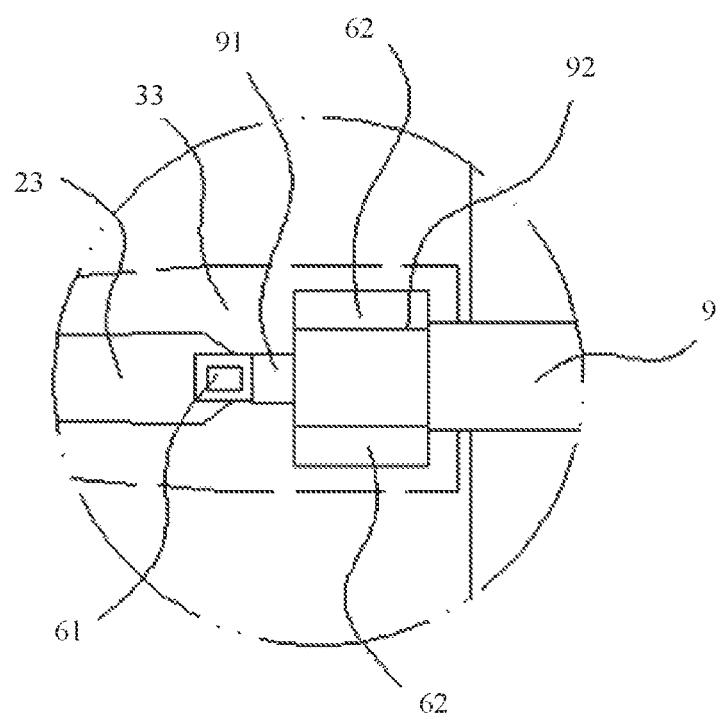
FIG. 20 is an enlarged view of an H part of FIG. 19.

For example, as shown in FIG. 20, when a coaxial line 9 is connected, the coaxial line 9 includes a core wire 91 and an outer metal layer 92 wrapped around the core wire 91. A coaxial line slot may be provided at an end, close to the coaxial line pad 6, of the insulation substrate 1. The coaxial line 9 is inserted into the coaxial line slot, the core wire 91 is connected to the core wire connecting port 61, and the outer metal layer 92 is connected to the outer metal connecting port 62. In addition, alternatively, a coaxial line slot may not be provided on the insulation substrate 1. The coaxial line 9 is entirely disposed above the insulation substrate 1. The outer metal layer 92 is directly in contact with and welded to the outer metal connecting port 62. The core wire 91 is located above the core wire connecting port 61 and is not in contact with the core wire connecting port 61. The core wire 91 may be welded to the core wire connecting port 61 by stacking soldering tin.

Figure 14:
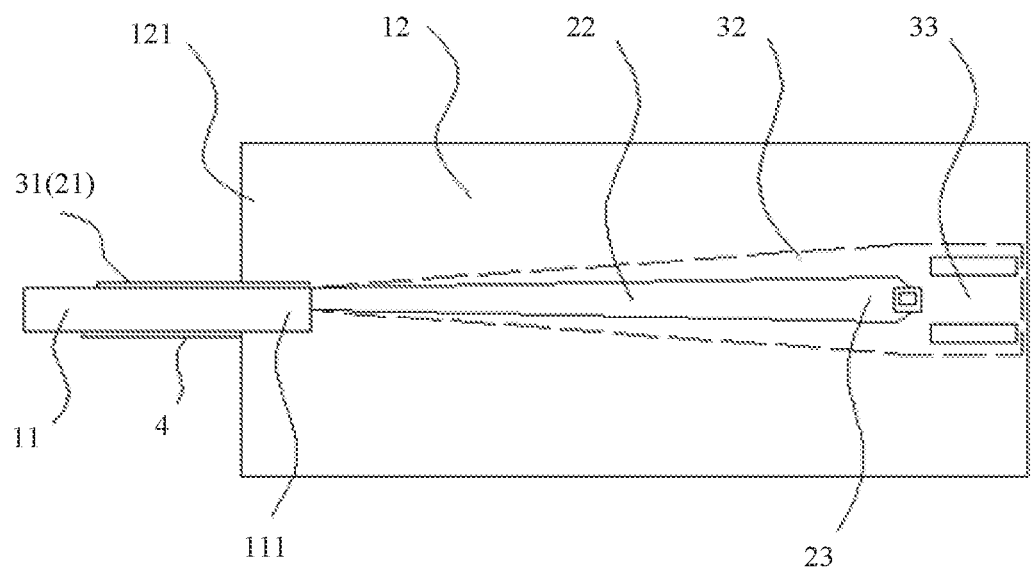
FIG. 14 is an A-direction view of FIG. 13.

The insulation substrate 1 may be alternatively formed by combining two substrates. As shown in FIG. 14, the insulation substrate 1 includes a first insulation substrate 11 and a second insulation substrate 12. The first balance signal connecting section 21 of the first microstrip 2 and the second balance signal connecting section 31 of the second microstrip 3 are disposed on a first surface of the first insulation substrate 11, the conductive ground 4 is disposed on a second surface of the first insulation substrate 11, and the first surface of the first insulation substrate 11 is opposite to the second surface of the first insulation substrate 11. The first impedance matching section 22 and the unbalance signal connecting section 23 of the first microstrip 2 are disposed on a first surface of the second insulation substrate 12, and the second impedance matching section 32 and the ground section 33 of the second microstrip 3 are disposed on a second surface of the second insulation substrate 12. The first balance signal connecting section 21 of the first microstrip 2 and the second balance signal connecting section 31 of the second microstrip 3 extend to a first edge 111 of the first insulation substrate 11, the first impedance matching section 22 of the first microstrip 2 and the second impedance matching section 32 of the second microstrip 3 extend to a second edge 121 of the second insulation substrate 12, the first edge 111 of the first insulation substrate 11 is connected to the second edge 121 of the second insulation substrate 12, the first balance signal connecting section 21 is electrically connected to the first impedance matching section 22, and the second balance signal connecting section 31 is electrically connected to the second impedance matching section 32.

Figure 13:
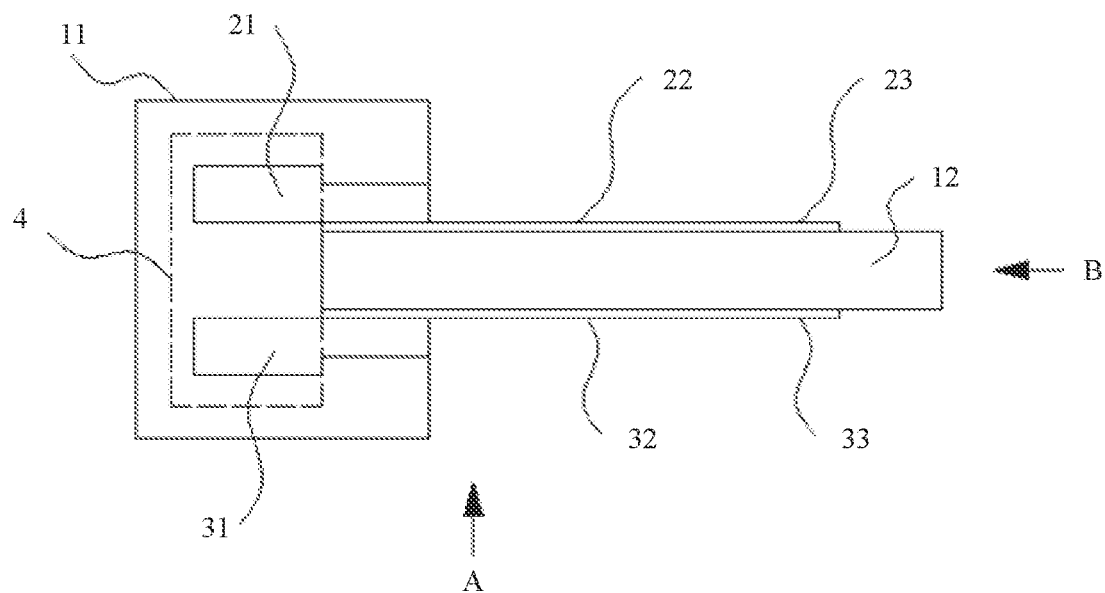
FIG. 13 is a schematic structural diagram of a balance-unbalance conversion apparatus in which two substrates are vertically inserted according to an embodiment of this application.
Figure 15:
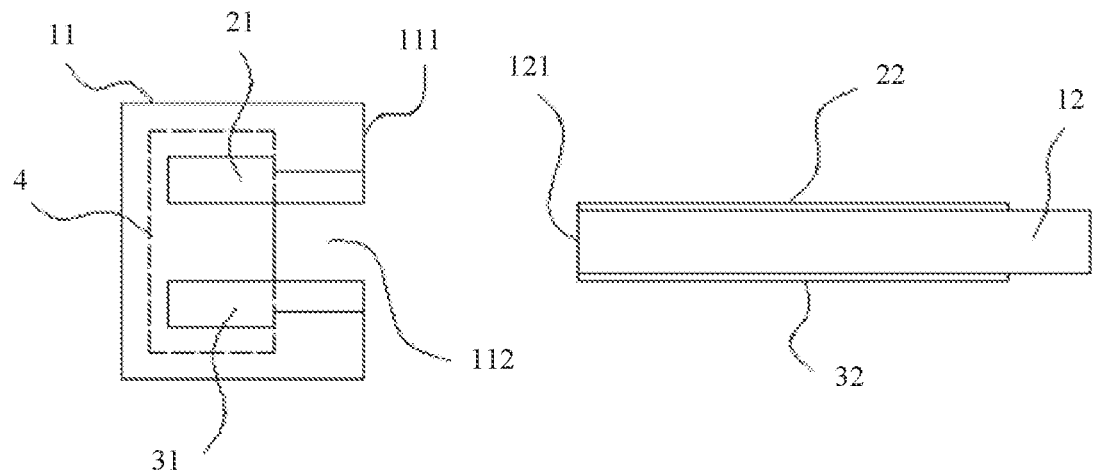
FIG. 15 is a schematic structural exploded view of FIG. 13.
Figure 16:
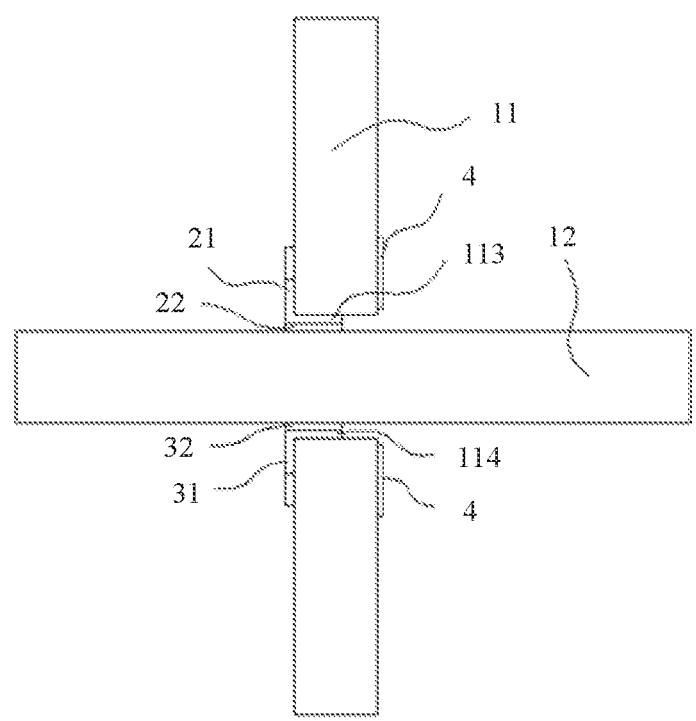
FIG. 16 is a B-direction view of FIG. 13.

In a possible implementation, the first insulation substrate 11 and the second insulation substrate 12 are plug-connected. As shown in FIG. 15, a slot 112 is provided at the first edge 111 of the first insulation substrate 11. The slot 112 may penetrate the first surface and the second surface of the first insulation substrate 11 in a thickness direction. When the first insulation substrate 11 is comparatively thick, alternatively, the slot 112 may not penetrate the first surface and the second surface of the first insulation substrate 11, and the slot 112 is located between the first balance signal connecting section 21 and the second balance signal connecting section 31. As shown in FIG. 16, a first side wall of the slot 112 is close to the first balance signal connecting section 21 and is provided with a first conductive sheet 113 connected to the first balance signal connecting section 21, a second side wall of the slot 112 is close to the second balance signal connecting section 31 and is provided with a second conductive sheet 114 connected to the second balance signal connecting section 31, and the first insulation substrate 11 and the second insulation substrate 12 are perpendicular to each other. As shown in FIG. 13 and FIG. 14, the second edge 121 of the second insulation substrate 12 is inserted into the slot 112, the first conductive sheet 113 is welded to the first impedance matching section 22, and the second conductive sheet 114 is welded to the second impedance matching section 32. It should be noted that the first insulation substrate 11 and the second insulation substrate 12 may be perpendicular to each other, or may be disposed at a specific included angle. This is not limited herein.

Figure 17:
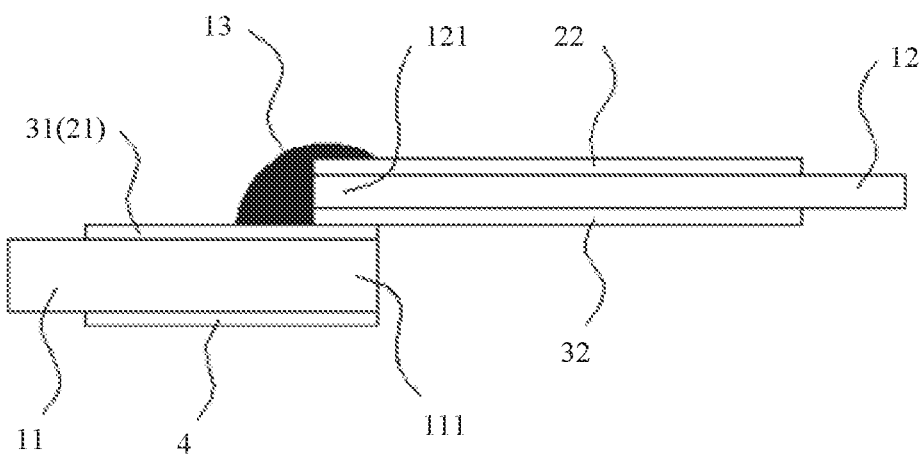
FIG. 17 is a schematic structural diagram of a balance-unbalance conversion apparatus in which two substrates are crimped in parallel according to an embodiment of this application.
Figure 18:
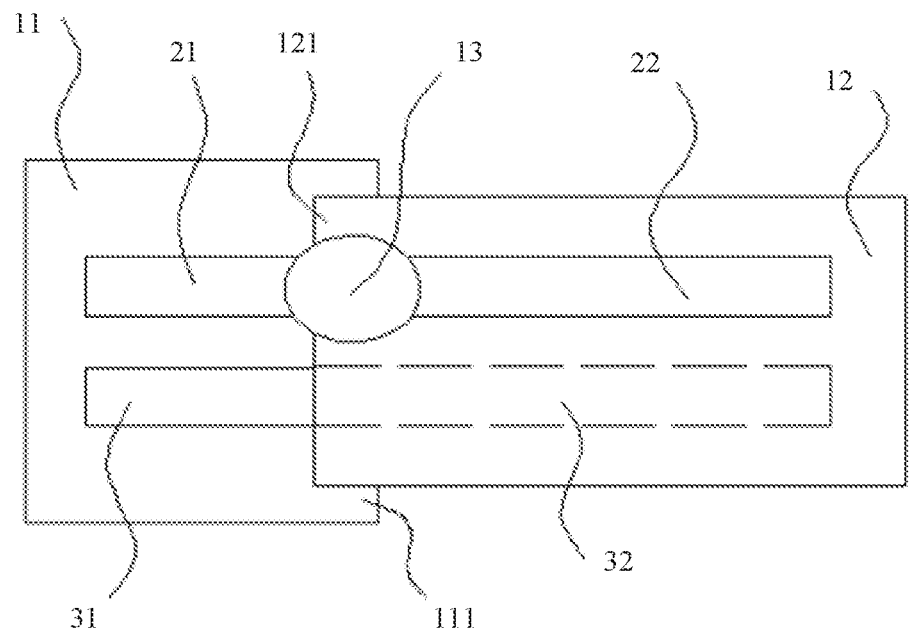
FIG. 18 is a top view of FIG. 17.

In another possible implementation, the first insulation substrate 11 and the second insulation substrate 12 are crimped in parallel. As shown in FIG. 17 and FIG. 18, the first insulation substrate 11 and the second insulation substrate 12 are parallel to each other, the first edge 111 and the second edge 121 are superposed, the first balance signal connecting section 21 is welded to the first impedance matching section 22 by using a welding joint 13, and the second balance signal connecting section 31 is crimped to the second impedance matching section 32.

It should be noted that, as shown in FIG. 2, FIG. 4, FIG. 9, FIG. 12, FIG. 13, FIG. 14, and FIG. 15, a left edge of the conductive ground 4 may exceed left edges of the first balance signal connecting section 21 and the second balance signal connecting section 31, and a right edge of the conductive ground 4 is aligned with right edges of the first balance signal connecting section 21 and the second balance signal connecting section 31. In addition, in another possible embodiment, a left edge of the conductive ground 4 may be alternatively aligned with left edges of the first balance signal connecting section 21 and the second balance signal connecting section 31, that is, a length of the conductive ground 4 is equal to a length of the first balance signal connecting section 21 and the second balance signal connecting section 31.

Figure 19:
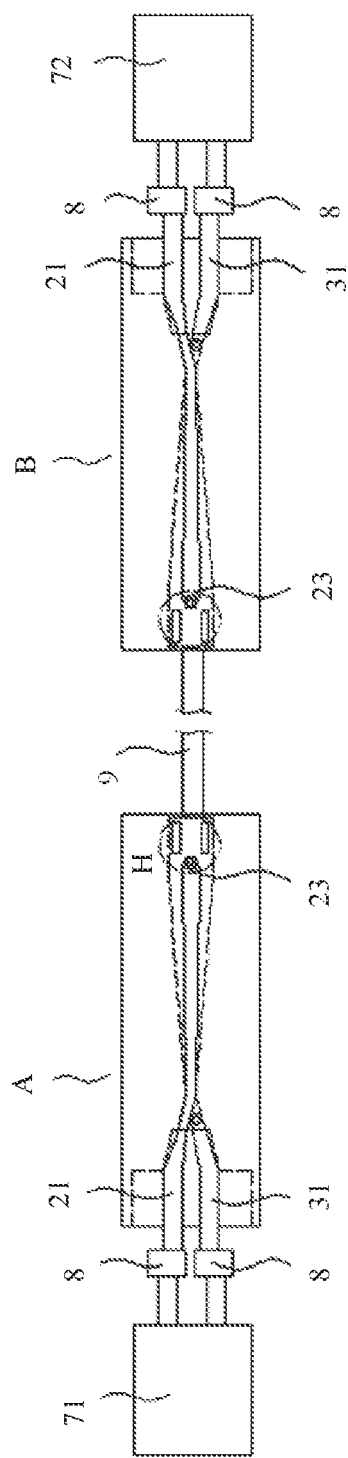
FIG. 19 is an architectural diagram of an application of a balance-unbalance conversion apparatus according to an embodiment of this application.

FIG. 19 is an architectural diagram of an application of a balance-unbalance conversion apparatus according to an embodiment of this application. A first chip 71 outputs a differential signal, and the differential signal enters a differential-to-single-ended balance-unbalance conversion apparatus A through a first balance signal connecting section 21 and a second balance signal connecting section 31. However, a direct-current blocking capacitor 8 may be introduced before differential-to-single-ended conversion is performed, so that the signal that enters the balance-unbalance conversion apparatus is an alternating-current signal without a direct-current component. An unbalance signal connecting section 23 of the balance-unbalance conversion apparatus A may be connected to a coaxial transmission line 9. A single-ended signal enters the coaxial transmission line 9, and arrives at a single-ended-to-differential balance-unbalance conversion apparatus B after being transmitted for a specific distance. An unbalance signal connecting section 23 of the single-ended-to-differential balance-unbalance conversion apparatus B is connected to the coaxial transmission line 9. A first balance signal connecting section 21 and a second balance signal connecting section 31 of the single-ended-to-differential balance-unbalance conversion apparatus are connected to a second chip 72.

It should be noted that the balance-unbalance conversion apparatus in this application may be applied to an intra-subrack backplane and an on-board cable (On Board Cable, OBC). In addition, the balance-unbalance conversion apparatus in this application may be further applied to various optical modules and active/passive cable interfaces, including but not limited to a small form-factor pluggable (Small Form-factor Pluggable, SFP) optical module, a quad small form-factor pluggable (Quad Small Form-factor Pluggable, QSFP) optical module, a quad small form-factor pluggable double density (Quad Small Form-factor Pluggable-double density, QSFP-DD) optical module, a 12×10 Gbps pluggable (12×10 Gbps Pluggable, CXP) optical module, and the like.

This application further provides a communications device, including a circuit board. An integrated circuit and at least one balance-unbalance conversion apparatus are disposed on the circuit board. The balance-unbalance conversion apparatus is the balance-unbalance conversion apparatus in any embodiment of the first aspect.

In an embodiment, the integrated circuit includes a first balance signal port and a second balance signal port. The first balance signal port is connected to a first balance signal connecting section 21 of the balance-unbalance conversion apparatus. The second balance signal port is connected to a second balance signal connecting section 31 of the balance-unbalance conversion apparatus.

A connector may be further disposed on the circuit board of the communications device. The connector includes an unbalance signal port and an external port. The unbalance signal port of the connector may be connected to an unbalance signal connecting section of the balance-unbalance conversion apparatus. The external port of the connector may be connected to another communications device.

This application further provides a communications system, including a first communications device and a second communications device. Both the first communications device and the second communications device are the communications device in any one of the foregoing embodiments. A balance-unbalance conversion apparatus of the first communications device is connected to a balance-unbalance conversion apparatus of the second communications device.

In an embodiment, the balance-unbalance conversion apparatus of the first communications device and the balance-unbalance conversion apparatus of the second communications device may be connected by using a coaxial transmission line. In the communications system provided in this application, a coaxial transmission line may be used for a connection, and has advantages of a higher density, higher electrical performance, more flexible winding, and lower costs compared with a biaxial cable.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A balance-unbalance conversion apparatus, comprising:
an insulation substrate;
a first microstrip, wherein:
the first microstrip comprises a first balance signal connecting section, a first impedance matching section, and an unbalance signal connecting section that are sequentially connected, wherein the first balance signal connecting section is configured to transmit a first component of a balance signal, and the unbalance signal connecting section is configured to transmit an unbalance signal;
a second microstrip, wherein:
the second microstrip comprises a second balance signal connecting section, a second impedance matching section, and a ground section that are sequentially connected, wherein the second balance signal connecting section is configured to transmit a second component of the balance signal, and the ground section is configured to connect to a ground signal; and a conductive ground, wherein:
the conductive ground is a reference ground of the first balance signal connecting section and the second balance signal connecting section, and the conductive ground is located relatively closer to the second impedance matching section than to the ground section, wherein:
the first microstrip, the second microstrip, and the conductive ground are all disposed on the insulation substrate, the first balance signal connecting section and the second balance signal connecting section are located on a same plane of the insulation substrate, and the first impedance matching section of the first microstrip and the second impedance matching section of the second microstrip are separated by the insulation substrate; and a cross-sectional area of at least one of a part of the first microstrip or a part of the second microstrip has a gradient.

2. The balance-unbalance conversion apparatus according to claim 1, wherein:
the insulation substrate comprises a first insulation substrate and a second insulation substrate, the first balance signal connecting section of the first microstrip and the second balance signal connecting section of the second microstrip are disposed on a first surface of the first insulation substrate, the conductive ground is disposed on a second surface of the first insulation substrate, and the first surface of the first insulation substrate is opposite to the second surface of the first insulation substrate; and
the first impedance matching section and the unbalance signal connecting section of the first microstrip are disposed on a first surface of the second insulation substrate, and the second impedance matching section and the ground section of the second microstrip are disposed on a second surface of the second insulation substrate.

3. The balance-unbalance conversion apparatus according to claim 2, wherein:
the first balance signal connecting section of the first microstrip and the second balance signal connecting section of the second microstrip extend to a first edge of the first insulation substrate, the first impedance matching section of the first microstrip and the second impedance matching section of the second microstrip extend to a second edge of the second insulation substrate, the first edge of the first insulation substrate is connected to the second edge of the second insulation substrate, the first balance signal connecting section is electrically connected to the first impedance matching section, and the second balance signal connecting section is electrically connected to the second impedance matching section.

4. The balance-unbalance conversion apparatus according to claim 3, wherein:
a slot is provided at the first edge of the first insulation substrate, wherein the slot is located between the first balance signal connecting section and the second balance signal connecting section, a first side wall of the slot is close to the first balance signal connecting section and is provided with a first conductive sheet connected to the first balance signal connecting section, a second side wall of the slot is close to the second balance signal connecting section and is provided with a second conductive sheet connected to the second balance signal connecting section, the second edge of the second insulation substrate is inserted into the slot, the first conductive sheet is welded to the first impedance matching section, and the second conductive sheet is welded to the second impedance matching section.

5. The balance-unbalance conversion apparatus according to claim 3, wherein:
the first insulation substrate and the second insulation substrate are parallel to each other, the first edge and the second edge are superposed, the first balance signal connecting section is welded to the first impedance matching section by using a welding joint, and the second balance signal connecting section is crimped to the second impedance matching section.

6. The balance-unbalance conversion apparatus according to claim 1, wherein:
the first balance signal connecting section comprises a first parallel section and a first tilt section, wherein the first parallel section is configured to transmit the first component of the balance signal, one end of the first tilt section is connected to the first parallel section, and the other end of the first tilt section is connected to the first impedance matching section;
the second balance signal connecting section comprises a second parallel section and a second tilt section, wherein the second parallel section is parallel to the first parallel section, the second parallel section is configured to transmit the second component of the balance signal, one end of the second tilt section is connected to the second parallel section, and the other end of the second tilt section is connected to the second impedance matching section; and
the conductive ground comprises a first reference ground and a second reference ground, wherein the first reference ground is a reference ground of the first parallel section and the second parallel section, and the second reference ground is a reference ground of the first tilt section and the second tilt section.

7. The balance-unbalance conversion apparatus according to claim 6, wherein the first tilt section gradually approaches the second tilt section in a direction away from the first parallel section, and the second tilt section gradually approaches the first tilt section in a direction away from the second parallel section.

8. The balance-unbalance conversion apparatus according to claim 6, wherein a cross-sectional area of the first reference ground remains unchanged, and a cross-sectional area of the second reference ground has a gradient.

9. The balance-unbalance conversion apparatus according to claim 6, wherein cross-sectional areas of the first parallel section and the second parallel section remain unchanged, and cross-sectional areas of the first tilt section and the second tilt section have a gradient.

10. The balance-unbalance conversion apparatus according to claim 1, wherein:
a cross-sectional area of the first impedance matching section gradually decreases in a direction toward the unbalance signal connecting section, and a cross-sectional area of the second impedance matching section gradually decreases in a direction toward the ground section.

11. The balance-unbalance conversion apparatus according to claim 10, wherein:
- a cross-sectional thickness of the first impedance matching section remains unchanged, and a cross-sectional width of the first impedance matching section gradually increases in a direction toward the unbalance signal connecting section, so that the cross-sectional area of the first impedance matching section gradually increases in the direction toward the unbalance signal connecting section; and a cross-sectional thickness of the second impedance matching section remains unchanged, and a cross-sectional width of the second impedance matching section gradually increases in the direction toward the ground section, so that the cross-sectional area of the second impedance matching section gradually increases in the direction toward the ground section; or
- the cross-sectional thickness of the first impedance matching section remains unchanged, and the cross-sectional width of the first impedance matching section gradually decreases in the direction toward the unbalance signal connecting section, so that the cross-sectional area of the first impedance matching section gradually decreases in the direction toward the unbalance signal connecting section; and the cross-sectional thickness of the second impedance matching section remains unchanged, and the cross-sectional width of the second impedance matching section gradually decreases in the direction toward the ground section, so that the cross-sectional area of the second impedance matching section gradually decreases in the direction toward the ground section.

12. The balance-unbalance conversion apparatus according to claim 1, wherein:
- the first balance signal connecting section comprises a first parallel section and a first tilt section, wherein the first parallel section is configured to transmit the first component of the balance signal, one end of the first tilt section is connected to the first parallel section, and the other end of the first tilt section is connected to the first impedance matching section;
- the second balance signal connecting section comprises a second parallel section, wherein the second microstrip further comprises an impedance transition section, the impedance transition section and the second impedance matching section are located on a same plane, one end of the impedance transition section is connected to the second parallel section through a via, and the other end of the impedance transition section is connected to the second impedance matching section;
- the conductive ground comprises a first reference ground, wherein the first reference ground is a reference ground of the first parallel section and the second parallel section; and
- impedance formed by the first tilt section and the impedance transition section remains unchanged and is the same as impedance formed by the first parallel section, the second parallel section, and the first reference ground, or
- impedance formed by the first tilt section and the impedance transition section has a gradient, so that a smooth transition from the impedance formed by the first parallel section, the second parallel section, and the first reference ground to the impedance formed by the unbalance signal connecting section and the ground section is implemented.

13. The balance-unbalance conversion apparatus according to claim 1, wherein a magnetic piece is sleeved on at least a part of the first impedance matching section and at least a part of the second impedance matching section.

14. The balance-unbalance conversion apparatus according to claim 1, wherein a projection of the first impedance matching section on a plane on which the second impedance matching section is located overlaps the second impedance matching section.

15. The balance-unbalance conversion apparatus according to claim 1, wherein:
- the first microstrip and the second balance signal connecting section of the second microstrip are disposed on a first surface of the insulation substrate, the second impedance matching section and the ground section of the second microstrip are disposed on a second surface of the insulation substrate, the second balance signal connecting section and the second impedance matching section are connected through a conductive via that penetrates the first surface and the second surface of the insulation substrate, and the conductive ground is disposed on the second surface of the insulation substrate.

16. The balance-unbalance conversion apparatus according to claim 1, wherein the first balance signal connecting section and the second balance signal connecting section each are connected to a direct-current blocking capacitor.

17. A communications device, comprising a circuit board, wherein an integrated circuit and at least one balance-unbalance conversion apparatus are disposed on the circuit board, and wherein the at least one balance-unbalance conversion apparatus comprises:
- an insulation substrate;
- a first microstrip, wherein:
  - the first microstrip comprises a first balance signal connecting section, a first impedance matching section, and an unbalance signal connecting section that are sequentially connected, wherein the first balance signal connecting section is configured to transmit a first component of a balance signal, and the unbalance signal connecting section is configured to transmit an unbalance signal;
- a second microstrip, wherein:
  - the second microstrip comprises a second balance signal connecting section, a second impedance matching section, and a ground section that are sequentially connected, wherein the second balance signal connecting section is configured to transmit a second component of the balance signal, and the ground section is configured to connect to a ground signal; and
- a conductive ground, wherein:
  - the conductive ground is a reference ground of the first balance signal connecting section and the second balance signal connecting section, and the conductive ground is located relatively closer to the second impedance matching section than to the ground section,
- wherein:
  - the first microstrip, the second microstrip, and the conductive ground are all disposed on the insulation substrate, the first balance signal connecting section and the second balance signal connecting section are located on a same plane of the insulation substrate, and the first impedance matching section of the first microstrip and the second impedance matching section of the second microstrip are separated by the insulation substrate; and a cross-sectional area of at least one of a part of the first microstrip or a part of the second microstrip has a gradient.

18. The communications device according to claim 17, wherein:
the integrated circuit comprises a first balance signal port and a second balance signal port, the first balance signal port is connected to a first balance signal connecting section of the at least one balance-unbalance conversion apparatus, and the second balance signal port is connected to a second balance signal connecting section of the at least one balance-unbalance conversion apparatus.

19. A communications system, comprising:
a first communications device and a second communications device, wherein the first communications device and the second communications device comprise, respectively:
a circuit board, wherein an integrated circuit and at least one balance-unbalance conversion apparatus are disposed on the circuit board, and wherein the at least one balance-unbalance conversion apparatus comprises:
an insulation substrate;
a first microstrip, wherein:
the first microstrip comprises a first balance signal connecting section, a first impedance matching section, and an unbalance signal connecting section that are sequentially connected, wherein the first balance signal connecting section is configured to transmit a first component of a balance signal, and the unbalance signal connecting section is configured to transmit an unbalance signal;
a second microstrip, wherein:
the second microstrip comprises a second balance signal connecting section, a second impedance matching section, and a ground section that are sequentially connected, wherein the second balance signal connecting section is configured to transmit a second component of the balance signal, and the ground section is configured to connect to a ground signal; and
a conductive ground, wherein:
the conductive ground is a reference ground of the first balance signal connecting section and the second balance signal connecting section, and the conductive ground is located relatively closer to the second impedance matching section than to the ground section,
wherein:
the first microstrip, the second microstrip, and the conductive ground are all disposed on the insulation substrate, the first balance signal connecting section and the second balance signal connecting section are located on a same plane of the insulation substrate, and the first impedance matching section of the first microstrip and the second impedance matching section of the second microstrip are separated by the insulation substrate; and
a cross-sectional area of at least one of a part of the first microstrip or a part of the second microstrip has a gradient; and
wherein a balance-unbalance conversion apparatus of the first communications device is connected to a balance-unbalance conversion apparatus of the second communications device.

20. The communications system according to claim 19, wherein:
the first communications device comprises a first chip and a first balance-unbalance conversion apparatus, the second communications device comprises a second chip and a second balance-unbalance conversion apparatus, the first chip is configured to output a first balance signal, the second chip is configured to receive the first balance signal, the first balance-unbalance conversion apparatus is configured to convert the first balance signal output by the first chip into a first unbalance signal and transmit the first unbalance signal to the second balance-unbalance conversion apparatus, and the second balance-unbalance conversion apparatus is configured to convert the first unbalance signal into a second balance signal and transmit the second balance signal to the second chip.

* * * * *